(12) United States Patent
Silvestre

(10) Patent No.: US 11,312,617 B2
(45) Date of Patent: Apr. 26, 2022

(54) MEMS DEVICE BUILT USING THE BEOL METAL LAYERS OF A SOLID STATE SEMICONDUCTOR PROCESS

(71) Applicant: Nanusens SL, Cerdanyola del Vallès (ES)

(72) Inventor: Josep Montanyà Silvestre, Cerdanyola del Vallès (ES)

(73) Assignee: Nanusens SL, Cerdanyola del Valles (ES)

( * ) Notice: Subject to any disclaimer, the term of this patent is extended or adjusted under 35 U.S.C. 154(b) by 0 days.

(21) Appl. No.: 17/145,014

(22) Filed: Jan. 8, 2021

(65) Prior Publication Data

US 2021/0206624 A1    Jul. 8, 2021

Related U.S. Application Data

(60) Provisional application No. 63/133,596, filed on Jan. 4, 2021, provisional application No. 63/000,199, filed on Mar. 26, 2020, provisional application No. 63/000,195, filed on Mar. 26, 2020, provisional application No. 62/958,369, filed on Jan. 8, 2020.

(51) Int. Cl.
  *B81B 3/00*   (2006.01)
  *B81C 1/00*   (2006.01)
  *B81B 7/00*   (2006.01)

(52) U.S. Cl.
  CPC .......... *B81B 3/0021* (2013.01); *B81B 7/0006* (2013.01); *B81C 1/00142* (2013.01); *B81C 1/00325* (2013.01); *B81B 2201/0228* (2013.01); *B81B 2203/0163* (2013.01); *B81B 2207/07* (2013.01)

(58) Field of Classification Search
  CPC .............................. B81C 1/00246; B81B 7/02
  See application file for complete search history.

(56) References Cited

U.S. PATENT DOCUMENTS

| | | | |
|---|---|---|---|
| 7,446,300 B2 | 11/2008 | Montanya | |
| 7,663,538 B2 | 2/2010 | Montanya | |
| 7,782,026 B2 | 8/2010 | Montanya | |
| 7,876,182 B2 | 1/2011 | Montanya | |
| 9,685,295 B2 * | 6/2017 | King | H01J 1/02 |
| 2010/0295138 A1 * | 11/2010 | Montanya Silvestre | B81C 1/00246 257/415 |

(Continued)

FOREIGN PATENT DOCUMENTS

| | | |
|---|---|---|
| TW | 201542442 A | 11/2005 |
| TW | 201319604 A | 5/2014 |

OTHER PUBLICATIONS

Tseng, S-H., et al., Implementation of a monolithic capacitive accelerometer in a wafer-level 0.18 μm CMOS MEMS process, J. Micromech. Microeng., 2012, 22:1-13.

(Continued)

*Primary Examiner* — Moazzam Hossain
(74) *Attorney, Agent, or Firm* — Burns & Levinson LLP; Christopher Carroll

(57) ABSTRACT

A MEMS device formed using the materials of the BEOL of a CMOS process where a post-processing of vHF and post backing was applied to form the MEMS device and where a total size of the MEMS device is between 50 um and 150 um. The MEMS device may be implemented as an inertial sensor among other applications.

8 Claims, 9 Drawing Sheets

(56) References Cited

U.S. PATENT DOCUMENTS

| | | |
|---|---|---|
| 2012/0090393 A1 | 4/2012 | Montanya Silvestre et al. |
| 2013/0018930 A1 | 1/2013 | Lacapra et al. |
| 2014/0225250 A1 | 8/2014 | Montanya et al. |

OTHER PUBLICATIONS

Tsai, M-H., et al., "The CMOS-MEMS 3-Axis Capacitive Accelerometer to Meet the Commercial Specifications", MEMS, 2016, 1002-1005.

Michalik, P., et al., "CMOS BEOL-embedded z-axis accelerometer", Electronics Letter, 2015, 51(11):865-867.

Michalik, P., et al., "CMOS BEOL-embedded lateral accelerometer", Universitat Politècnica de Catalunya, Electronic Engineering Department, 2015.

Fernandez, D., et al., "Experiments on the Release of CMOS-Micromachined Metal Layers", Journal of Sensors, 2010, pp. 1-7.

Silvestre, J., "Ultra-low Cost MEMS Devices in Standard CMOS", SEMICON Europa, 2012.

Michalik, et al., "Experiments on MEMS Integration in 0.25 μm CMOS Process, "Sensors, 2018, 18, 2111, doi:10.3390/s18072111, www.mdpi.com/journal/sensors.

Valle, et al., "Experimental Analysis of Vapor HF Etch Rate and Its Water Level Uniformity on a CMOS-MEMS Process," Journal of Microelectromechanical Systems, vol. 25, No. 2, Apr. 2016, downloaded Mar. 6, 2022 from IEEE Xplore.

\* cited by examiner

MEMS DEVICE BUILT USING THE BEOL METAL LAYERS OF A SOLID STATE SEMICONDUCTOR PROCESS

REFERENCE TO RELATED APPLICATIONS

This application claims priority to and the benefit of U.S. Provisional Patent Application No. 63/133,596, filed on Jan. 4, 2021, entitled "MEMS Device Built Using the BEOL Metal Layers of a Solid State Semiconductor Process," U.S. Provisional Patent Application No. 62/958,369, filed on Jan. 8, 2020, entitled "Leverage Ultrasound Transducer (LUT) using MEMS," U.S. Provisional Patent Application No. 63/000,195, filed on Mar. 26, 2020, entitled "Systems and Methods for Inertial Sensors Having an Array of Spiral Springs," and U.S. Provisional Patent Application No. 63/000,199, filed on Mar. 26, 2020, "Systems and Methods for an Air Compliance Barometer using MEMS CMOS Devices." The entire contents of the above-referenced patent applications are incorporated herein by reference.

TECHNICAL FIELD

This application relates generally to MEMS devices and, more particularly, to techniques for fabricating MEMS devices.

BACKGROUND

An integrated circuit is a semiconductor device that has a substrate of a semiconductor material on which a series of layers are deposited using photolithographic techniques. The layers are doped and polarized so that electrical elements (e.g., resistances, capacitors, or impedances) or electronic elements (e.g., diodes or transistors) are produced. Subsequently other layers are deposited, which form the structure of interconnection layers necessary for electrical connections.

Micro-electro-mechanisms or micro-electro-mechanical systems (MEMS) are small electro-mechanical devices made using layer deposition technologies based on photolithographic techniques. MEMS may provide cavities or hollow spaces in the inside thereof, which may be filled with liquids or gases. Conventional integrated circuits are completely solid devices, i.e., without any kind of hollows. Hollows may be defined as cavities that are larger than hollows on the atomic or subatomic scale. MEMS may have mobile elements inside them. The mobile elements may be joined by one of the ends thereof to the rest of the MEMS structure, or may be completely loose (i.e., not physically attached to its surroundings) inside a housing that is at least partially closed (to prevent the loose part from "escaping" from the MEMS). A chip may include a MEMS device and an integrated circuit (IC), where the IC may control the MEMS.

The main problem with MEMS devices nowadays is the need for a bespoke manufacturing process. This has not happened with solid state electronics, which has converged towards a manufacturing standard, called complementary metal-oxide semiconductor (CMOS), which has many variants, mainly classified in terms of its node. This is the minimum feature size that the process can resolve at the front-end-of-line (FEOL).

In practical terms most of the MEMS ICs found in the market today consist on a package that has two dice inside. One of these dice comes from a CMOS wafer and the other from the MEMS wafer being produced at a bespoke process. The dice inside the package are typically wire-bonded and packaged using a plastic package. For combo ICs requiring several MEMS devices, the package may need to have more than two dice inside, being one the CMOS having the control electronics, and several MEMS dice, built in a different manufacturing process each of them.

This requirement of a proprietary manufacturing process for each MEMS manufacturer and for each type of MEMS device, has several problems: cost, size, time-to-market, performance and volume production capability. Since 90% of the semiconductor industry consists in solid state ICs, that is without MEMS, and most of them are built with CMOS processing, most of the semiconductor companies use the so-called fabless model, thus outsourcing all the production to large CMOS foundries, which are corporations whose business is focused only on producing CMOS wafers.

This generates an economy of scale World-wide of typically ×100 or more compared to the largest MEMS foundries. That is why the cost of MEMS processing is more expensive than the cost of CMOS wafers. However the cost of a MEMS wafer could be less than the cost of a CMOS wafer, especially if we consider lower nodes, but that is because of the much increased complexity of a CMOS process compared to a MEMS one. But for the same level of complexity, CMOS would have a much lower cost than any MEMS process. If the MEMS could be built using the same CMOS process, the cost of the whole IC would be drastically reduced. This is because to start with we would not need two dice, but just one inside the package. So we would eliminate the MEMS die, and we would simplify also the packaging.

There is an interest in reducing the size of the ICs, specifically for applications like smartphones and even more with wearables and in particular earbuds, where the space is very constrained. The best packaging technique used today to minimize the whole size of the IC is Wafer Level Chip Scale Packaging (WLCSP). This is essentially a deposition of a sealing layer on top of the wafer to protect it, the bumping of the pads, and then dicing the wafer, with a previous optional back-grinding. There can be additional steps in the process like RDL (Redistribution Layers), but they are not essential or needed in all the implementations. However WLCSP cannot be used if there is a need to package more than one die. If the MEMS could be built within the same CMOS die, we would be able to apply WLCSP to package it, thus largely reducing the overall package die and, if it was possible, to implement different types of MEMS devices into the same CMOS process. Then a manufacturer could be able to build combo chips packaged with WLCSP. This would result in even much more shrinkage compared to the multi-die plastic package counterparts being used today.

When a new type of MEMS device is developed, there is a need to develop a new manufacturing process to build that new MEMS device. Due to the volumes that this process will have to handle, being MEMS market typical for consumer and hence very large volumes, and the high yield expected out of it in order to minimize cost, this is a complex project, which typically will need several years and a high cost. If the MEMS could be built using the same CMOS process, which already exists, ready to produce large volumes and at a low cost, then time-to-market would be minimal, because only the device would have to be developed. There would be no need to spend time (and cost) to develop a bespoke manufacturing process.

Due to the different economy of scale existing for a CMOS vs. a MEMS process, the equipment used in CMOS processes are state-of-the-art, while, for MEMS processes, they are usually legacy equipment, to reduce the cost of setting up these MEMS processes. This means that the smallest feature size, also called critical dimension, is usually smaller with CMOS processes than with MEMS processes. Therefore if one could build the MEMS using the CMOS manufacturing process, they would be able to manufacture MEMS devices having small feature sizes. This would help to improve the device performance, because it would be possible to build softer springs/membranes and also smaller gaps.

In addition to this, if one could build the MEMS using the CMOS process, they would minimize the parasitic capacitance that appears when connecting the MEMS to the electronic interface (typically sensing/driving) circuitry in the CMOS die. This is usually done via wire-bonding inside the plastic package, which adds capacitances typically in the order of 1 pF to 10 pF. With the MEMS built inside the same CMOS process, this parasitic capacitance coming from the connection of the MEMS to the electronics would be reduced down to typically 1 fF to 10 fF. This is a ×100 to ×1000 reduction. Since the parasitic capacitance reduces the performance of the MEMS device, because it masks the capacitance of the MEMS device, reducing it enables one to improve the performance of the MEMS IC. Improving performance means increasing the sensitivity of the sensor, reducing its power consumption, or a combination of the two.

Furthermore, as it has been mentioned mainstream CMOS foundries have volume production capabilities which are more than ×100 times larger than the main MEMS foundries. So if we could build the MEMS devices using CMOS processing, we would benefit from this larger volume production capability. This would allow us to tackle new markets, like IoT (Internet of Things), which otherwise it would be impossible. Nowadays it is difficult to serve the existing MEMS market by the MEMS providers, because their volume production capability is limited. IoT is expected to increase the current MEMS market volume by a factor of ×100 or more. This can only be achieved today if the MEMS device is built using a CMOS mainstream foundry.

Some companies use a monolithic solution to build the MEMS together with the CMOS. This leaves a single die, at the end of the manufacturing process, having both the CMOS and the MEMS. The two options to build this are either bonding the MEMS and the CMOS wafer, after being manufactured separately, or building the MEMS wafer above the finished CMOS wafer, instead of starting with a blanket silicon wafer. In both cases, there is a need for a bespoke MEMS manufacturing process. These monolithic solutions reduce the size of the IC, because there is no need for wirebonding and it is possible to use WLCSP with them. And also they improve a bit the performance due to the lower parasitic interconnection capacitance between the MEMS and the CMOS, which typically reduces down to between 100 fF and to 1 pF.

However the previous approach still has the problems of cost, time-to-market and volume production capability, as they keep needing a full bespoke MEMS process. Also while the size is reduced and performance increased, this would still be considerably better if we were capable of building the MEMS using the CMOS process. Because in terms of size, the profile will always be larger, as essentially we will have two dice one on top of the other. But with CMOS it is one die and this can be back-grinded. With respect to performance, this is a ×10 reduction of parasitic capacitance compared to the conventional two dice package solution, but building the MEMS device using the CMOS process we would get a ×100 reduction.

And ultimately these monolithic solutions only work if we have a single MEMS device or sensor. If we need a combo chip combining different types of sensors, this cannot be applied anymore. But building all these MEMS devices using the CMOS process, we keep having a single die solution that can be backgrinded. So when we move to combo chips, the cost and size advantages of building the MEMS with the CMOS process increase significantly.

The cost and size reduction, even more when we move to combo chips, comes in part from the reduction of many bonding pads, which are no longer needed. Given the advantages that are known if we were able to build the MEMS devices using the CMOS manufacturing process, a number of solutions have been proposed. Initial solutions were proposing a modification of the CMOS processing, to add some steps in order to build the MEMS devices. Depending on whether these were performed at the beginning, in the middle or at the end of the CMOS process, the solution was called pre-processing, intra-processing or post-processing.

The modification of the CMOS process was required because MEMS devices, given that they need to perform a mechanical movement, they need some empty space inside the IC to perform this movement. And these empty spaces are something that CMOS cannot produce. Another reason for the modification was to add layers of different material, or with different mechanical properties, that were not found in the CMOS process.

Given the very large cost of implementing modern CMOS processes in mainstream foundries, and also the cost of keeping them stable, to keep producing very large volumes while keeping a very high yield, the pre and intra-process modifications have been abandoned. The only remaining option is CMOS post-processing, to implement the MEMS.

CMOS post-processing means that after completing the manufacturing of the CMOS wafers, they go through a few additional manufacturing steps, where the MEMS is implemented. However, unlike the previously explained monolithic approach, consisting on either wafer bonding or building the MEMS above the CMOS wafer, in this case we simply create the empty spaces needed to allow the mechanical movement of the MEMS. And the MEMS is then built using the materials that exist inside the CMOS wafer.

Although one possibility would be to implement the MEMS using polysilicon, this requires a deep etch to get there, either from the top of the wafer, therefore etching through all the back-end-of-line (BEOL) first, or from the back, requiring a deep etch through the silicon substrate. This requires a complex process that would not be cost effective.

The only solution that remains then, is to use the materials existing in the BEOL of the CMOS to implement the MEMS. Since the BEOL is the topmost part of the CMOS die, this will require the minimal post-processing, and hence the minimal cost.

Different solutions have been proposed for this using, for example, combinations of plasma and/or wet etching with HF and other chemicals. These process are difficult to take into volume production with a high yield, especially when involving wet etching.

The simple post-processing approach that has been previously proposed consists in using a single vapour HF (vHF) mask-less post-processing step. The vHF etches away the silicon oxide existing in between the metal layers of the BEOL and it leaves all the metals. This was proposed by Baolab. Because of its simplicity it is the lowest cost CMOS post-processing approach. Furthermore, it can be implemented in the same CMOS foundry or in the packaging or assembly house.

In this approach, the MEMS device is built using the metal layers, typically Al or AlCu and W, but there could be also others like Cu. It is possible to trap oxide inside metal casing with the right designs. Other materials may be used, but they must exist in the CMOS BEOL. Most of the previous approaches use a special package, such as a laminate one, e.g., LGA, in order to protect the MEMS. This increases the cost and the size, thus minimizing or eliminating the size and cost advantages, that we would otherwise get building the MEMS using the CMOS process.

Baolab proposed to use the top most metal layer to protect the MEMS, while having small holes that would allow the vHF to go inside the MEMS cavity. Later a second set of post-processing steps consisting in Al sputtering and patterning would be applied, to seal properly the MEMS device. This is typically a 10% cost adder to the CMOS process. This simplifies the packaging requirements, and it is no longer needed to use a laminate or other special packaging. Instead any standard packaging technique, like QFN or another, could be used. This reduces cost and size of the final IC.

In addition to the top metal layer, the bottom metal layer was used to complete a metal cavity where the MEMS device is located. This was done to limit the etching of vHF towards the bottom, given that most CMOS processes do have a doped silicon oxide below M1, which is the bottom most metal layer. Doped silicon oxide reacts very aggressively to vHF, increasing quickly the etching speed, and leaving very nasty residues that would be difficult to eliminate. This makes the designs portable to most CMOS processes, as otherwise it would only be applicable to special ones not having doped silicon oxide under the bottom most metal layer of the BEOL.

Baolab's solution, like the other solutions using the materials in the BEOL to implement the MEMS devices, surrounds the MEMS device with metallic walls, which define the MEMS cavity within the ASIC die. This way the electronics is placed around it. The implementation of these metallic walls is made with a stack-up of metal layers (usually made with aluminum) and vias (usually tungsten). However the materials could be different, mainly copper, if we go to lower CMOS nodes, below 0.18 um processes. In principle, this is not a straight vertical wall, as DRC rules require metal layers to extend beyond the edges of the vias. However it is possible to make some exceptions to this, if we are interested in increasing the lateral area exposed on the wall, for instance in case of an in-plane capacitive sensor. This would then be a DRV that the foundry would have to accept.

Using Baolab's solution, vertical metallic walls in principle connect the top and bottom metal planes, thus shorting electrically all the MEMS cavity. Usually we will not be interested in this, or at least not happening everywhere in all the cavity. In order to solve this issue, Baolab used vertical interleaved anchor structures. These structures force the vHF to go up and down across the silicon oxide layers, until it is exhausted, thus leaving some unetched silicon oxide. This way we get a mechanical consistent wall, without electrically shorting the top and bottom metal plates.

One reason this is particularly effective is that usually the silicon oxide layers deposited between the metal layers of the BEOL of a CMOS process consist on two different sublayers each, having different oxide densities. Therefore, one of these layers etches away with vHF slower than the other. This way, etching the silicon oxide with vHF in the vertical direction is more difficult (i.e., it takes more time) than etching horizontally, as then the etching propagates faster along one of the silicon oxide sublayers. With these anchor structures we force the vHF to etch across all the slow etching rate sublayers, without being able to propagate quickly through the fast ones. These interleaved anchors can be used also to add columns or pillars at different locations of the MEMS, in order to provide more consistency to the top metal plane. This is particularly important in views of supporting the later sealing with Al sputtering typically, so that the top metal plane is not bended, which would end up destroying or leaving unusable the MEMS device.

The main problem with these anchor walls is that, although they provide mechanical robustness while leaving the top and bottom metal planes electrically disconnected, the electrical capacitance between them is very large. This is because of the large surface that is placed close to each other inside the interleaved anchor structure, one connected to the top and the other to the bottom plates, and even worse having an important fraction of this filled with silicon oxide.

Another problem related to the previous one is that there is a critical trade-off between this parasitic capacitance between top and bottom metal plates, versus production yield and reliability. In order to minimize this parasitic capacitance we can both minimize the length of the anchor structure, reducing the number of fingers and/or their heights, and/or we can increase the etching time. This way, if we want to minimize this parasitic capacitance, we will have small anchor structures with minimal quantity of silicon oxide remaining inside them after the vHF etching. However this will be a very weak structure, prone to easy mechanical failure due to mechanical shock, vibration, or simply when sealing or packaging the device. Also it will leave to low yield. Because a slightly overetch will remove completely the silicon oxide inside the anchor structure, producing a collapse of the top and bottom parts and leaving the device completely unusable. In production we need to avoid this requirement for a critical vHF etching, because it will always lead to a low yield. The reason is that the etching speed and the silicon oxide etched inside the MEMS cavity, does depend both on the vHF machine and recipe applied, but also on the CMOS processing. While we can have a tight control on the vHF machine and its recipe, we cannot control the CMOS process, which typically has tolerances in the order of 30%.

In addition to potentially requiring all the metal layers to implement the MEMS devices, thus needing special packaging processes, requiring specific CMOS processes without doped silicon oxide under the bottom most metal plate, and the large parasitic capacitances, two major problems with all the solutions using the materials in the CMOS BEOL to implement the MEMS, are yield and reliability. These problems are more critical when we use the Baolab approach, with top and bottom metal planes. However, if we don't use them, then the process becomes more complex and expensive, thus losing the cost advantage, and also the volume production, time to market and even the performance advantages.

One major problem found when using the BEOL metals of a CMOS process to implement MEMS devices, is the vertical stress gradient. This is something that is minimized in bespoke MEMS manufacturing processes. However, in a CMOS, since these metal lines where not intended to implement mechanical structures but just electrical connections, being surrounded by silicon oxide, in a solid state IC, residual stresses are less of a concern, resulting typically in large values. In addition to large residual stress, we typically find a large vertical stress gradient. This results in the metals bending or curling, typically upwards, but depending on the layers it can be downwards, especially on the top one. This bending is a big concern when we use top and bottom metal planes. Because then the vertical gap spacing available above and below the device is minimal, and it can easily touch them. When the MEMS device touches the top or bottom metal planes, it becomes unusable. This leads to very poor yield and reliability.

One possibility to reduce a bit this problem would be to increase this vertical gap distance, reducing the number of metal layers used for the MEMS device itself. However this would reduce performance in the out-of-plane direction, as the gap would be larger, and so the relative capacitance variation for a given sensor for the same displacement would be reduced. Also in the case of an inertial sensor, we would be forced to a smaller proof mass, not being able to use all the available metal layers, reducing even more the performance. And reducing the number of metal layers used to build the moveable part of the device, like the proof mass in the case of an inertial sensor, will increase even more its curvature, as explained later There is a need therefore to minimize the curvature height of the MEMS device. This is defined as the maximum vertical displacement, so in the out-of-plane direction, of any metal layer along all the MEMS device or a particular element of it.

One known solution to this problem is to stack-up two or more metal layers. This way we increase the radius of curvature of the resulting metal structure, thus reducing the total curvature height. However, and while this is a good solution to design some parts of MEMS devices, like the proof mass of a inertial sensor, which we want to make as large as possible to improve the sensitivity of the sensor, for other parts like the springs, it leads to very large stiffness, thus reducing largely the sensitivity. Actually stiffness is inversely proportional to the third power of the length versus thickness, so increasing the thickness it leads very quickly to very stiff springs. This means very low sensitivity for sensors, and large driving voltages for actuators. Furthermore, the stack-up of many layers is limited by the number of metal layers in the process, and if there is a need to modify or use a CMOS process with a larger number of metal layers in the BEOL, this will increase quickly its cost.

As a summary, there is a need to find the right designs to implement MEMS devices by reusing the BEOL materials existing in a standard CMOS process, using vHF to etch away part of the silicon oxide within the MEMS cavity, which can be packaged with WLCSP afterwards, and with these devices having a very high yield, reliability and performance.

Still another problem with using a vHF etching post process step after the CMOS, is that the SiN passivation layer deposited and patterned on the top of the CMOS wafer, it is partially etched away by vHF. This means that in practice, unless a very short vHF etching step is performed, the SiN passivation layer will be largely or totally etched away. This will leave nasty residues in the wafer and it will expose all the wafer with the ASIC area that should not have its silicon oxide etched away.

A known solution to prevent this is to increase the silicon content of the passivation, typically measured by the Refractive Index or RI of the layer. Although technically it is not something complex to be done, this requires a process tweak, and for large mainstream foundries it is very challenging that they accept it. Ultimately this requirement means that we will no longer be able to use a completely standard CMOS process, and hence we will be losing to some extent the advantages of low cost, short time to market and high volume production capability.

SUMMARY

The application, in various implementations, addresses deficiencies associated with fabricating MEMS devices.

In various aspects, the systems, devices, and methods result from or use vHF etching to etch away part of the silicon oxide in the BEOL of a CMOS process, thus releasing material existing in the BEOL that will constitute the MEMS device. The inventive approaches use a bottom metal plane and a top metal plane with an array of small holes to allow the vHF to go inside the MEMS cavity. A key inventive concept is to limit the overall MEMS size on the layout to between 50 µm and 150 µm, and preferably to less than 100 µm. For a given curvature radius of a MEMS device or element, the total curvature height depends on the horizontal size. Therefore, if the device is small enough, the curvature height will be limited, despite having a large vertical stress gradient.

A second inventive concept is the design of the springs. In order to have good performance with such small devices, small and soft springs are needed, while keeping also a small curvature height. These seem to be contradictory requirements. Short springs means that they will be very stiff, so sensitivity (performance) of the MEMS sensors will be reduced. To have soft springs we will need to minimize their thickness, which means minimizing metal stacking or not using it at all. But this will increase the vertical stress gradient, thus increasing quickly the total curvature height.

A preferred inventive solution to the spring design problem is to use not one but a set of at least three springs, distributed evenly around the device, rotated around the device central axis, so that by symmetry the MEMS device cannot be tilted after being released with the vHF etching.

In the case of an inertial sensor, the MEMS device may include a central proof mass, made with several metal stack up, so that it is quite flat compared to the springs around it. This proof mass may also be larger than the springs, in order to have enough sensitivity. If the spring or springs that hold it are curved, then if the proof mass is tilted, it will end up having a large curvature height, despite of the proof mass itself being relatively flat. However, if the springs are located evenly around it, and there are at least three of them, then the proof mass will experience a small vertical displacement due to the curvature of the springs, but it will be flat, hence not contributing to the total vertical height with its large size.

In certain implementations, the central mass will have a circular shape, and the springs around it will have a spiral shape, and be made with only one metal layer or a stack-up of just two metal layers. In case of using a stack-up of two metal layers, we will join them with the via layer in between. In a preferred implementation, this via layer will have the same linear or spiral shape as the metal layers above and below, but in principle it will be a bit narrower laterally, to satisfy DRC rules at least in one horizontal direction at each point. Throughout this application, when we say that we use a stack-up of a certain set of metal layers, it will be understood that we will be using the via layers in between them to keep them connected. Using circular and rounded shapes for the proof mass, the springs, and in general for all or as many parts of the MEMS device as possible, avoids the high mechanical stress that would otherwise be accumulated on the straight angles of the device geometry. These rounded shapes then facilitates the balance of the stress of the springs, and it leads to the horizontal tilt that we need for the central mass when we use an array of at least three evenly distributed springs around it.

One aspect includes a MEMS device formed using the materials of the BEOL of a CMOS process, where a post-processing of vHF and post backing was applied to form the MEMS device and a total size of the MEMS device is between 50 um and 150 um. The total size of the MEMS device may be less than 100 um. In some implementations, the total size of the MEMS device is less than or equal to 50 um. The MEMS device may include a set of at least three springs distributed evenly around the MEMS device and rotated around a central axis of the MEMS device or its movable part. The device shape may be round and the springs may have a spiral shape. The springs may be made with a single metal layer or a stack-up of at least two metal layers. The MEMS device may include an inertial sensor.

The MEMS device may include a proof mass. The proof mass may be formed or made with a stack-up of four metal layers and the springs, where the springs are either connected to a top metal layer of the proof mass forming the stack-up or connected to two top metal layers of the stack-up. The springs may be connected to an external ring such that a portion thereof remains buried into a silicon oxide on its outer edge after the vHF etching.

In some implementations, the MEMS device has a top metal plane and a bottom metal plane that is smaller than the top one. An outer ring width of the bottom metal plane may be less than or equal to 10% to 50% the width of an outer ring of the top metal plane. The outer ring width of the bottom metal plane may be about 30% of the width of the outer ring of the top metal plane. The MEMS device may include at least one pad, where the at least one pad includes a top metal layer arranged to extend between 15 μm to 25 μm laterally beyond a vertically aligned passivation opening in all directions. The at least one pad may extend 20 μm laterally beyond a vertically aligned passivation opening in all directions. The MEMS device may be formed within a MEMS cavity that does not include metal filling structures. In some implementations, a MEMS device is arranged with more capacitance to be able, for example, to use more conventional sensing circuitry to measure the MEMS capacitance. The MEMS device may be built with an array of MEMS devices connected electrically in parallel. Each of these MEMS devices would have its own passivation opening, and they would be totally disconnected, except for the lines/tracks making the electrical connections.

In another aspect, a MEMS device includes a set of at least three springs distributed evenly around the MEMS device and rotated around a central axis of the MEMS device. The device shape may be round and the springs may have a spiral shape. The springs may be made with a single metal layer or a stack-up of at least two metal layers. The MEMS device may include an inertial sensor. The MEMS device may include a proof mass, where the proof mass is made with a stack-up of four metal layers and the springs, and wherein the springs are either connected with a top metal layer of the proof mass forming the stack-up or connected with two top metal layers of the stack-up.

In a further aspect, a MEMS device includes springs where the ratio of the maximum displacement versus the spring length is at least 1%. The MEMS device may include a proof mass where the proof mass is made with a stack-up of four metal layers and the springs, and wherein the springs are either connected with a top metal layer of the proof mass forming the stack-up or connected with two top metal layers of the stack-up. The springs may be connected to an external ring such that a portion thereof remains buried into a silicon oxide on its outer edge after vHF etching. The MEMS device may include top and bottom metal planes where an outer ring width of the bottom metal plane is less than or equal to 10% to 50% the width of an outer ring of the top metal plane.

Yet another aspect is a method for manufacturing a MEMS device using the materials of the BEOL of a CMOS process including: applying a post-processing of vHF and post backing to form the MEMS device, where a total size of the MEMS device is between 50 um and 150 um. The total size of the MEMS device may be less than 100 um. The method may further include forming a set of at least three springs distributed evenly around the MEMS device and rotated around a central axis of the MEMS device.

The method may include forming a device shape that is round and forming the springs to have a spiral shape. The method may include forming the springs with a single metal layer or a stack-up of at least two metal layers. The method may form a MEMS device including an inertial sensor.

The method may include forming a proof mass, where the proof mass is made with a stack-up of four metal layers and the springs, and where the springs are either connected with a top metal layer of the proof mass forming the stack-up or connected with two top metal layers of the stack-up. The method may include connecting the springs to an external ring such that a portion thereof remains buried into a silicon oxide on its outer edge after the vHF etching.

The method may include forming the MEMS device to have a top metal plane and a bottom metal plane that is smaller than the top metal plane. The method may include forming an outer ring width of the bottom metal plane that is less than or equal to 10% to 50% the width of an outer ring of the top metal plane. The method may include forming the outer ring width of the bottom metal plane to be about 30% of the width of the outer ring of the top metal plane. The method may include forming the MEMS device within a MEMS cavity that does not include metal filling structures.

In a further aspect, a method for manufacturing a MEMS device includes forming a set of at least three springs distributed evenly around the MEMS device or its movable part and rotated around a central axis of the MEMS device or its movable part. The method may include forming a shape of the MEMS device that is round and forming the springs to have a spiral shape. The method may include forming the springs with a single metal layer or a stack-up of at least two metal layers. The method may include forming the MEMS device to include an inertial sensor. The method may include forming a proof mass, where the proof mass is made with a stack-up of four metal layers and the springs, and where the springs are either connected to a top metal layer of the proof mass forming the stack-up or connected to two top metal layers of the stack-up.

In yet a further aspect, a method for manufacturing a MEMS device includes forming springs where the ratio of the maximum displacement versus the spring length is at least 1%. The method may include forming a proof mass having a stack-up of four metal layers and the springs, where the springs are either connected with a top metal layer of the proof mass forming the stack-up or connected with two top metal layers of the stack-up. The method may include connecting the springs to an external ring such that a portion thereof remains buried into a silicon oxide on its outer edge after the vHF etching. The method may include forming an outer ring width of a bottom metal plane that is less than or equal to 10% to 50% the width of an outer ring of a top metal plane.

In a further aspect, a smartphone, wearable, earbud, or Internet-of-Things (IoT) device includes the MEMS devices according to the previously described aspects.

All of the inventive concepts described in this section and throughout the present application, although in principle applying to CMOS, may also be applicable to the BEOL of any other solid state semiconductor process, like BiCMOS, GaAs, SiGe, GaN, SOI, and so on.

Any two or more of the features described in this specification, including in this summary section, may be combined to form implementations not specifically described in this specification.

The details of one or more implementations are set forth in the accompanying drawings and the following description. Other features and advantages will be apparent from the description and drawings, and from the claims.

DESCRIPTION OF THE DRAWINGS

Like reference numerals in different figures indicate like elements.

DETAILED DESCRIPTION

The application, in various aspects, addresses deficiencies associated with the fabrication and/or structure of MEMS devices.

In various aspects, the systems, devices, and methods result from or use vHF etching to etch away part of the silicon oxide in the BEOL of a CMOS process, thus releasing material existing in the BEOL that will constitute the MEMS device. The inventive approaches use a bottom metal plane and a top metal plane with an array of small holes to allow the vHF to go inside the MEMS cavity. A key inventive concept is to limit the overall MEMS size on the layout to between 50 µm and 150 µm, and preferably to less than 100 µm. For a given curvature radius of a MEMS device or element, the total curvature height depends on the horizontal size. Therefore, if the device is small enough, the curvature height will be limited, despite having a large vertical stress gradient.

A second inventive concept is the design of the springs. In order to have good performance with such small devices, small and soft springs are needed, while keeping also a small curvature height. These seem to be contradictory requirements. Short springs means that they will be very stiff, so sensitivity (performance) of the MEMS sensors will be reduced. To have soft springs we will need to minimize their thickness, which means minimizing metal stacking or not using it at all. But this will increase the vertical stress gradient, thus increasing quickly the total curvature height.

A preferred inventive solution to the spring design problem is to use not one but a set of at least three springs, distributed evenly around the device, rotated around the device central axis, so that by symmetry the MEMS device cannot be tilted after being released with the vHF etching.

In the case of an inertial sensor, the MEMS device includes a central proof mass, made with several metal stack up, so that it is quite flat compared to the springs around it. This proof mass may also be larger than the springs, in order to have enough sensitivity. If the spring or springs that hold it are curved, then if the proof mass is tilted, it will end up having a large curvature height, despite of the proof mass itself being relatively flat. However, if the springs are located evenly around it, and there are at least 3 of them, then the proof mass will experience a small vertical displacement due to the curvature of the springs, but it will be flat, hence not contributing to the total vertical height with its large size.

Figure 1:
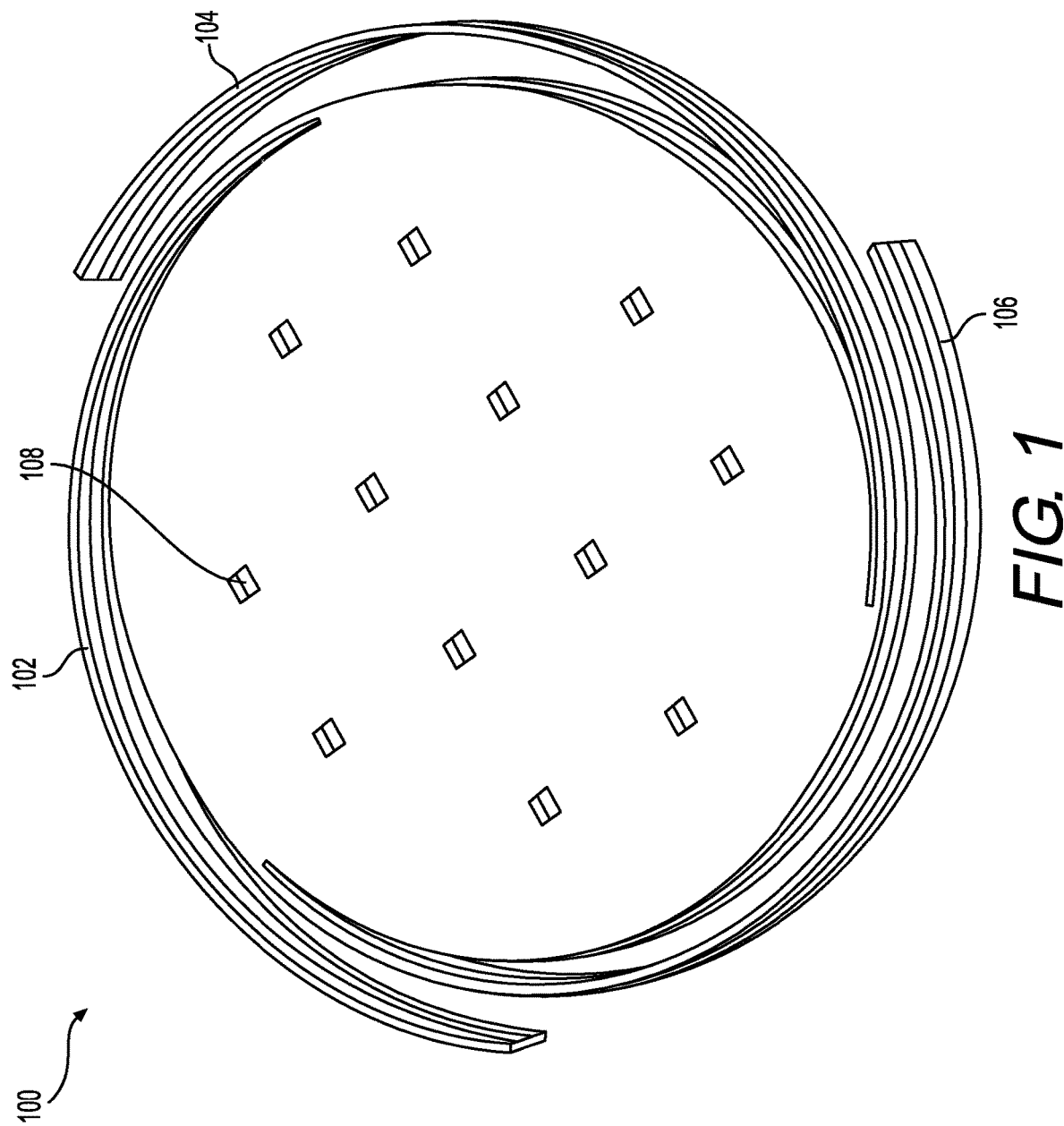
FIG. 1 shows a proof mass of a MEMS device having three springs connected to and spaced evenly around its circumference.

FIG. 1 shows a central and/or proof mass 100 of a MEMS device having three springs 102, 104, and 106 made and/or connected to and spaced evenly around its circumference. The proof mass 100 also includes an array of etching holes 108. In some implementations, the central mass 100 will have a circular shape, and the springs 102, 104, and 106 around it will have a spiral shape, and be made with only one metal layer or a stack-up of just two metal layers, or more than two layers. Using circular and rounded shapes for the proof mass 100, the springs 102, 104, and 106, and in general for all or as many parts of the MEMS device as possible, avoids the high mechanical stress that would otherwise be accumulated on the straight angles of the device geometry. These rounded shapes then facilitate a balance of the stress on the springs 102, 104, and 106, which leads to a horizontal tilt that we need for the central mass 100 when we use an array of at least three evenly distributed springs 102, 104, and 106 around it.

Although the number of springs can be increased, so that we can use four or more, and this would further help in achieving the horizontal tilt of the central proof mass 100, certain implementations have only three springs, because otherwise the overall stiffness of the MEMS device would increase proportionally to the number of springs, thus reducing its sensitivity.

Within this application, we will use the term "inertial sensor" to refer to a variety of devices that sense acceleration. This may include at least an accelerometer, a motion detector and a bone conduction sensor. Their physical principle of operation is the same, but their difference is in the frequencies that they detect. So their bandwidth and whether they need to sense direct current (DC) or not, and also their resolution and/or sensitivity requirements.

Another implementation may use straight pairs of springs, located at opposite sides of the proof mass 100, so that each pair of springs lies on the same straight line. This solution works because the residual stress of the metal lines is found to be tensile in most CMOS processes, sometimes with the exception of the top most metal layer. This way the curvature height is minimized. However, this solution leads to a relatively high stiffness, which is also highly dependent on the device temperature. Therefore, it is a solution that may be applicable to some MEMS devices, especially when a high mechanical resonant frequency is needed, and when temperature dependence of the spring stiffness is not critical.

If the proof mass (e.g., in the case of a inertial sensor) or the central part of the MEMS devices attached to the springs, is thicker than the springs, thus being made of a larger stack-up of metal layers, then an preferred implementation is for the springs to be made using the upper metal layers, if we connect the central part of the MEMS or proof mass to the top metal plane. This will minimize the parasitic capacitance of the springs and the supporting external rings towards the lower metal plate.

Figure 2:
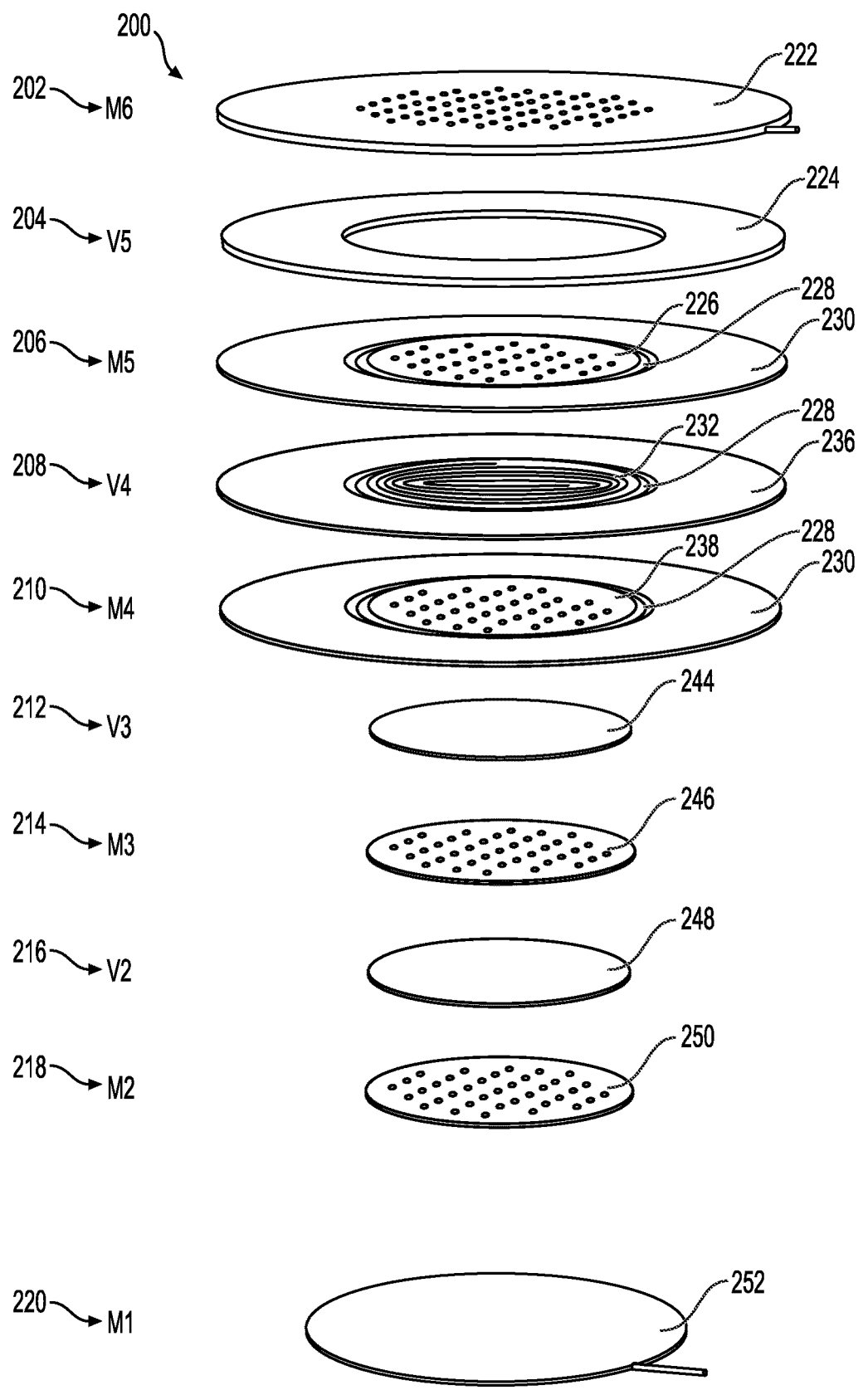
FIG. 2 is an exploded view of the metal and via layers of a MEMS device without showing the SiO2, passivation, and substrate.

FIG. 2 is an exploded view of the metal and via layers of a MEMS device 200 without showing the SiO2, passivation, and substrate. FIG. 2 describes an out-of-plane inertial sensor. It is built using a 6 metal BEOL CMOS process. Metal layers are numbered M1 (bottom) to M6 (top). There are 5 via layers, numbered V1 (between M1 and M2) up to V5 (between M5 and M6), although V1 is not used in this particular design. The proof mass has a circular structure, it has three spiral springs evenly placed around it, and the diameter of the proof mass plus the springs is 50 μm. The proof mass is made with a stack-up of metal layers M2 to M5, and the springs stacking up metal layers M4 and M5. The proof mass has concentric rings, stopped at the etching holes that go vertically across it, made with via layers V2 to V4.

The top metal plane has the same diameter plus an external ring of 20 μm width around it, which is equivalent of a circle having 90 μm of diameter. There is an array of 0.8 μm holes spaced approximately 5 μm between the center of each two holes in both X and Y directions. The springs have a surrounding ring of 20 μm width around them, built on the same layers M4 and M5. There is an array of concentric vias joining these rings and the top metal plane on these rings. That is, they are implemented at layers V4 and V5.

There is a circular bottom metal plane made with M1, with a diameter of also 50 μm plus an exterior ring of 6 μm width, so smaller than the external rings of the top layers for the top metal plane and the support of the springs. Together the internal circle and the external ring are equivalent to a circle of 62 μm diameter. The difference between the internal circle and the external ring comes from the fact that after the vHF etching, the external ring is partially etched and the edges keep buried (and subjected) to the silicon oxide. The top passivation is opened with a circular shape of 50 μm, which is above the MEMS device.

MEMS device 200 includes M6 layer 202, V5 layer 204, M5 layer 206, V4 layer 208, M4 layer 210, V3 layer 212, M3 layer 214, V2 layer 216, M2 layer 218, and M1 layer 220. M6 layer 202 includes a top plate 222 with etching holes arranged in an array and a connection to an ASIC. V5 layer 204 includes an array of concentric via rings 224 extending over the outer metal. M5 layer 206 includes a proof mass top lid 226 with array of etching holes. Layer 206 also includes a portion of spiral springs 228 and an outer metal ring 230. V4 layer 208 includes array 232 of concentric via rings extending over the outer metal, a portion of the spiral springs 228 that extends in the V4 layer 208, and array 236 of concentric via rings extending over the proof mass and stopping at the etching hole locations while surrounding the hole locations with square rings. M4 layer 210 includes a proof mass plane 238 with an etching hole array, a portion of spiral springs 228, and a portion of outer metal ring 230. V3 layer 212 includes an array of concentric via rings 244 extending over the proof mass and stopping at the etching hole locations while surrounding the hole locations with square rings. M3 layer 214 includes proof mass metal plane 246 with an etching hole array. V2 layer 216 includes an array 248 of concentric via rings extending over the proof mass, stopping at the etching hole locations and surrounding them with square rings. M2 layer 218 include proof mass metal bottom lid 250 including an etching hole array. M1 layer 220 includes bottom metal plane 252 including a connection to an ASIC.

A preferred implementation for an accelerometer, using a 6 metal layer process, where M1 layer 220 is the bottom layer and M6 layer 202 is the top one, would be as follows. M1 layer 220 would be used to implement the bottom plane and M6 layer 202 the top metal plane, which would be shorted to the proof mass and springs. The proof mass would be implemented using a stack-up of M2 layer 218 to M5 layer 206. And the springs 228 would be implemented using either only M5 layer 206 or a stack-up of M4 layer 210 and M5 layer 206.

If we set the total diameter of the proof mass plus the springs, then there is an optimum for the length or maximum angle that the springs rotate. Longer springs (longer total angle) means that they will be softer, but the proof mass will be smaller. Shorter springs will allow for a larger proof mass but the springs will be stiffer. Therefore there is always an optimum, which will depend on the specific design and process properties. In general however it is difficult to build reliable devices and with good yield with springs having angles of more than 360°. That is, preferably each individual spring will not complete a turn around the circular proof mass.

Another parameter that affects design yield, performance and reliability is the spacing around the springs. That is, the horizontal spacing or gap existing at each point of the springs without any other spring, proof mass, anchor or any part of the device (except at the edges of the spring, as they start and end up being fused with the outer ring or anchor/wall and the proof mass or other MEMS part). This obviously needs to be at least equal to the minimum spacing set by the process design rule checking (DRC). However in practice we will set it to a higher value, between x2 and x10 of this minimum spacing set by the DRC of the process. A preferred value is x5. For instance with a 180 nm process having a minimum gap DRC between metals of 300 nm, we will preferably set this horizontal spacing for the springs as 1.5 μm. The trade-off here is that for very large spacing we will reduce sensitivity and/or performance, because we will reduce more the proof mass area and hence mass for the same spring length (hence to achieve a given softness/stiffness for the springs). But reducing this horizontal spacing between the springs it will lead to poor yield and reliability.

Another key aspect of the springs, especially important when they are soft, such as in the case when we use a set of three or more spiral springs evenly distributed around a central proof mass, is to make them short enough, compared to the displacement (both vertical, so out-of-plane, and horizontal, so in-plane). Since we have small proof mass and we want very soft springs in order to achieve enough sensitivity, this would in principle be prone to stiction issues, which would lead to very poor reliability for these MEMS devices.

Figure 3:
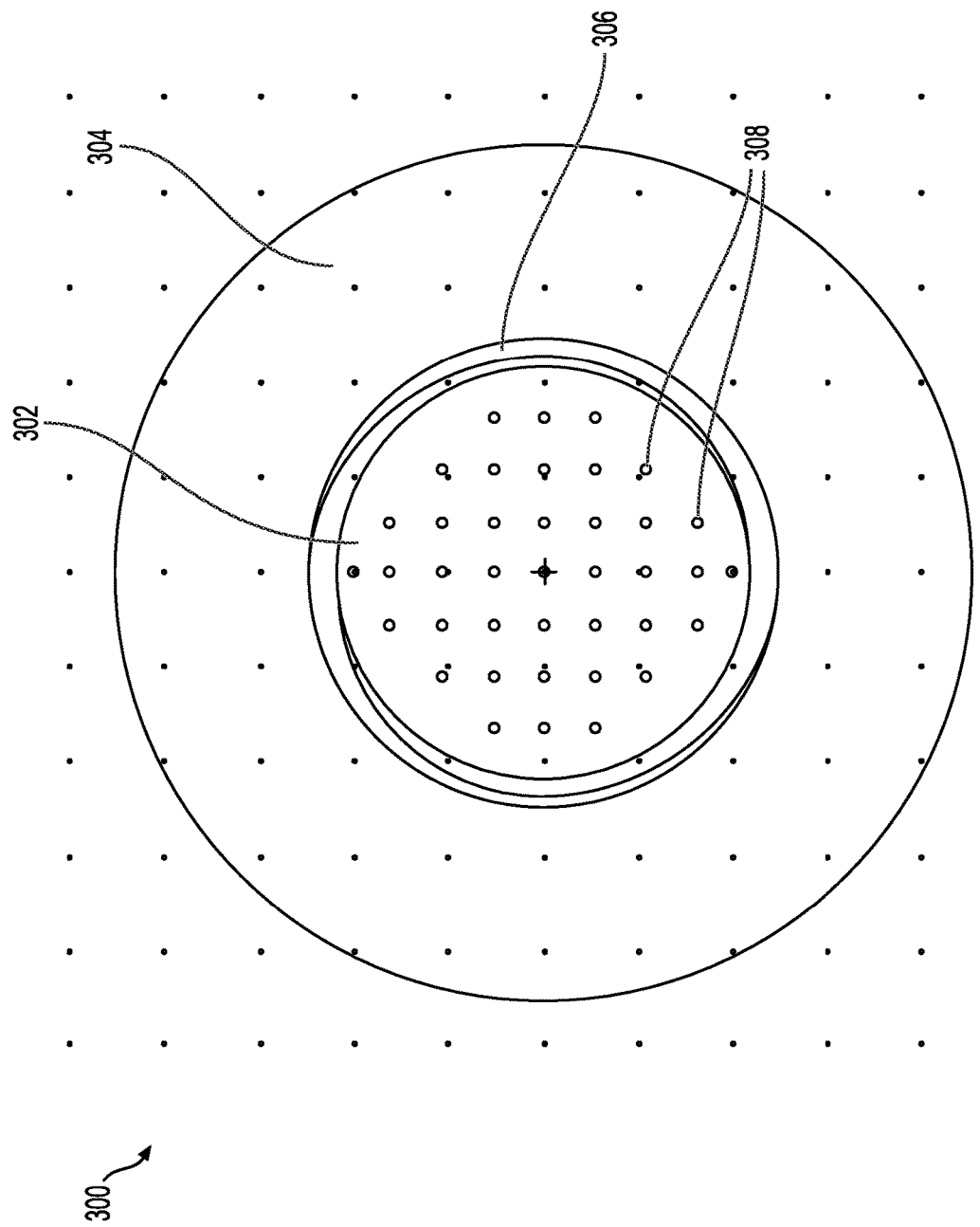
FIG. 3 is a zoomed view of the M4 layer of the MEMS device of FIG. 2.

FIG. 3 is a zoomed view 300 of the M4 layer 210 of the MEMS device of FIG. 2. M4 layer 210 includes a 50 μm circle metal plane 302 inside the proof mass, spiral springs 306, an external 20 μm width ring 304 partially buried into silicon oxide at the outside part after vHF etching to support the springs and hence the proof mass, and array 308 of etching holes going through the proof mass.

Figure 4:
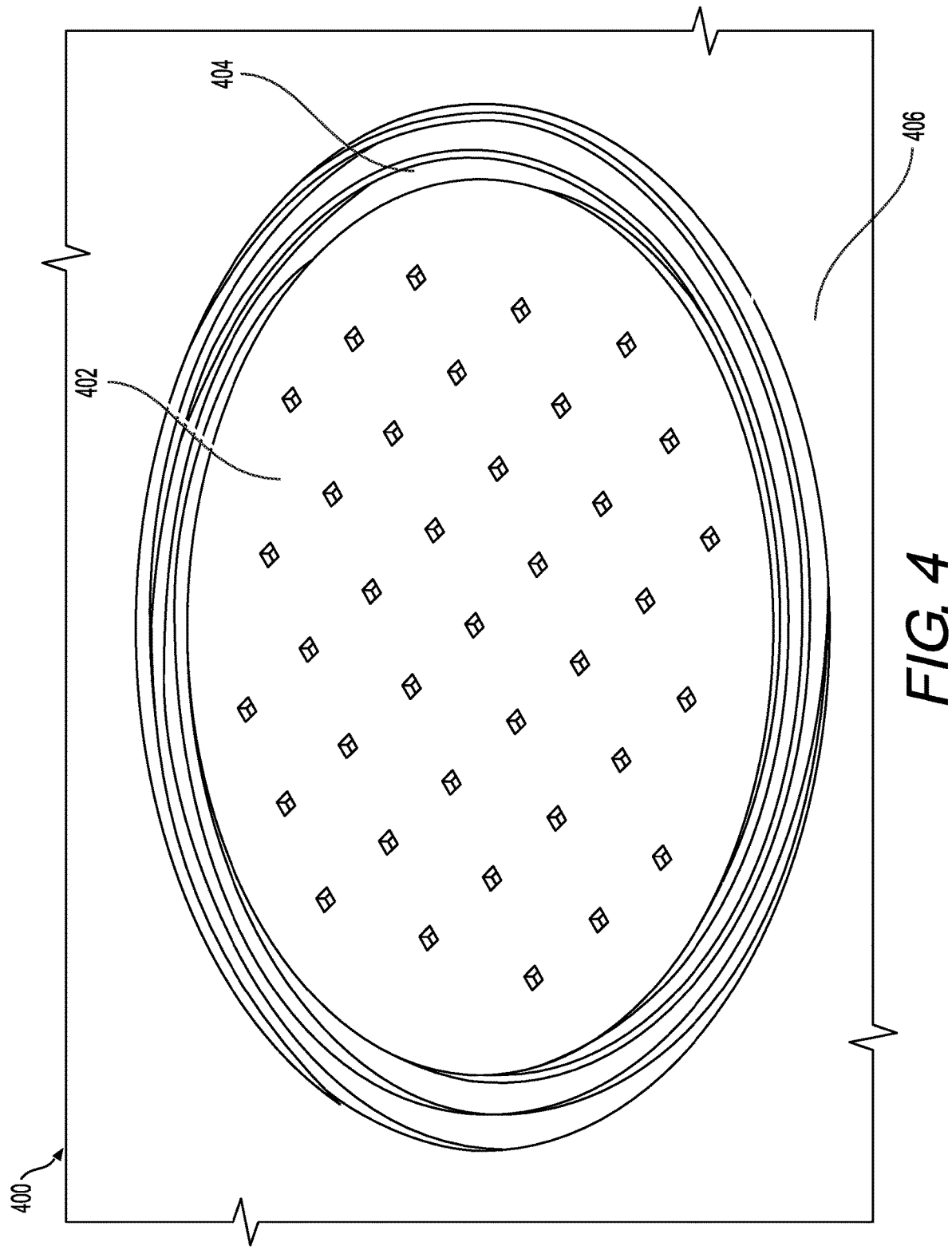
FIG. 4 is a zoomed view of the M5 layer of the MEMS device of FIG. 2.

FIG. 4 is a zoomed view 400 of the M5 layer 206 of the MEMS device of FIG. 2. M5 layer 400 includes proof mass top lid 402 having an array of etching holes, spiral springs 404, and outer metal ring 406.

Figure 5:
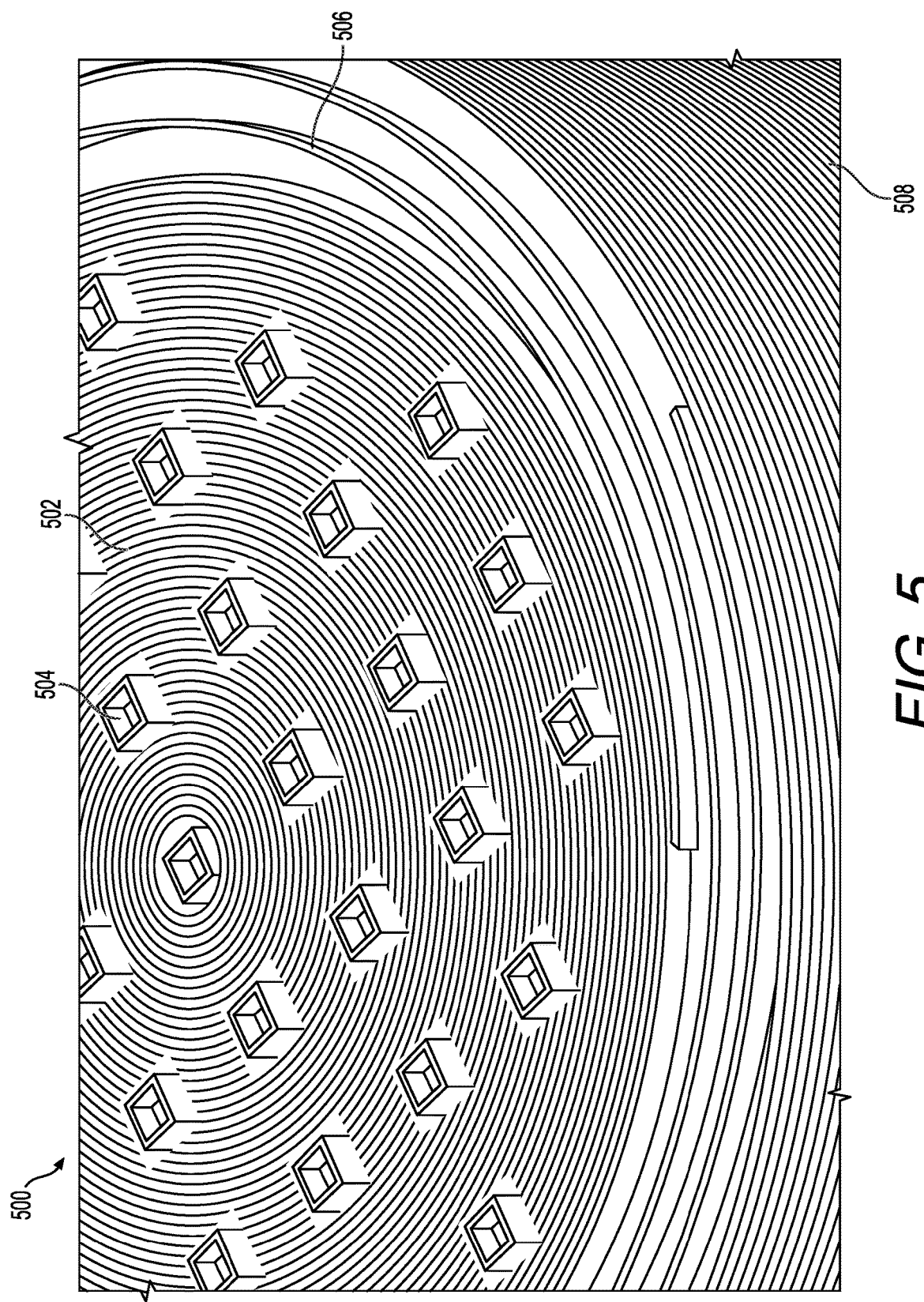
FIG. 5 is a zoomed view of the V4 layer of the MEMS device of FIG. 2.

FIG. 5 is a zoomed view 500 of the V4 layer 208 of the MEMS device of FIG. 2. V4 layer 500 includes an array 502 of concentric via rings extending over the proof mass, stopping at each etching hole 504 location and surrounding each hole 504 with a square ring. Layer 500 also includes an array 508 of the concentric via rings extending over the outer metal.

Figure 6:
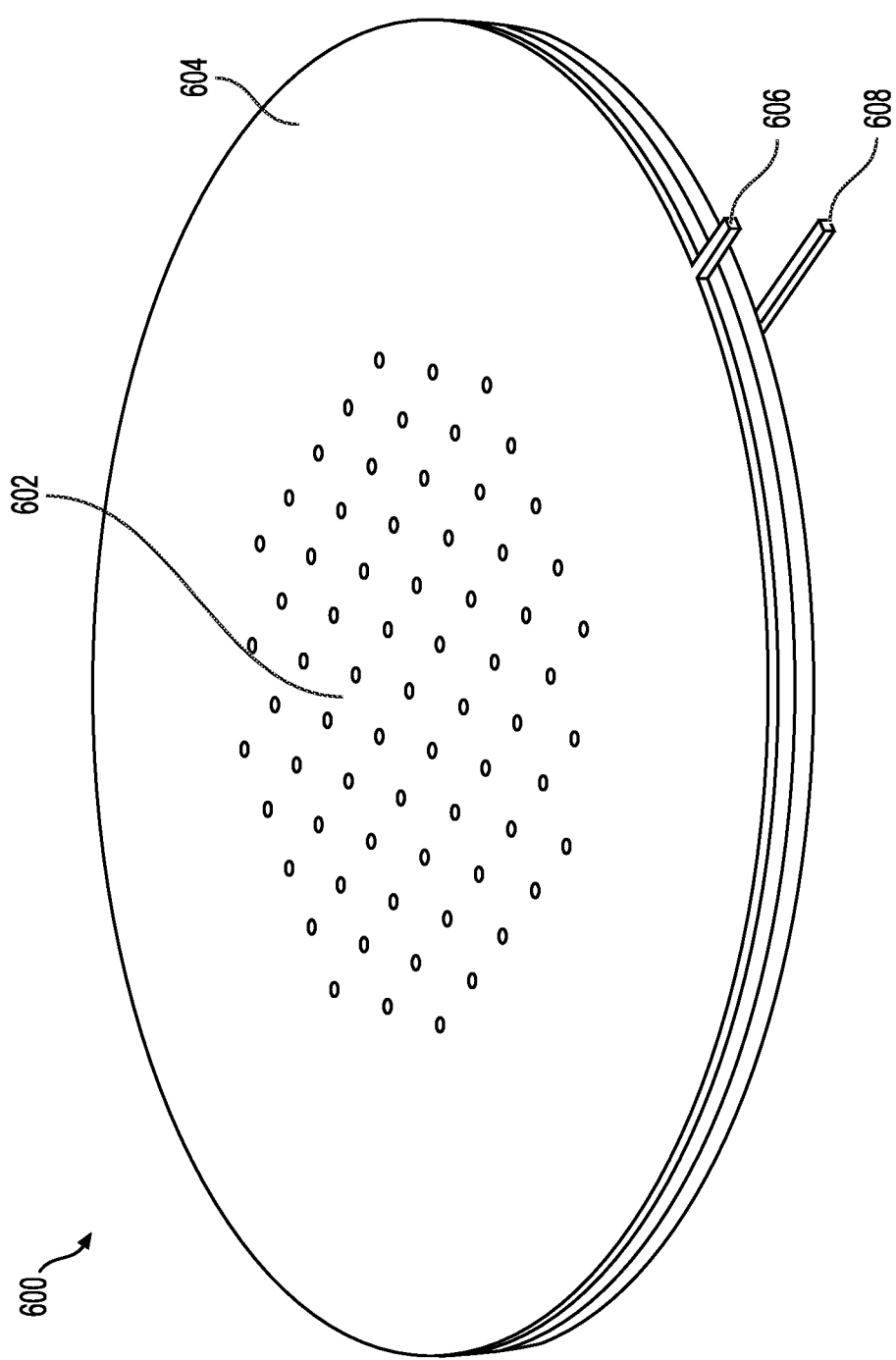
FIG. 6 is a three-dimensional view of the MEMS device of FIG. 2.

FIG. 6 is a non exploded 3D view 600 of the metal layers (so without showing the remaining silicon oxide, passivation and substrate) such as M6 layer 202 including etching holes of the MEMS device of FIG. 2. Layer 202 includes an array 602 of etching holes, an outer ring 604, a connection 606 to the ASIC (upper electrode and proof mass). M1 layer 220 includes a lower electrode connection 608 to the ASIC.

Figure 7:
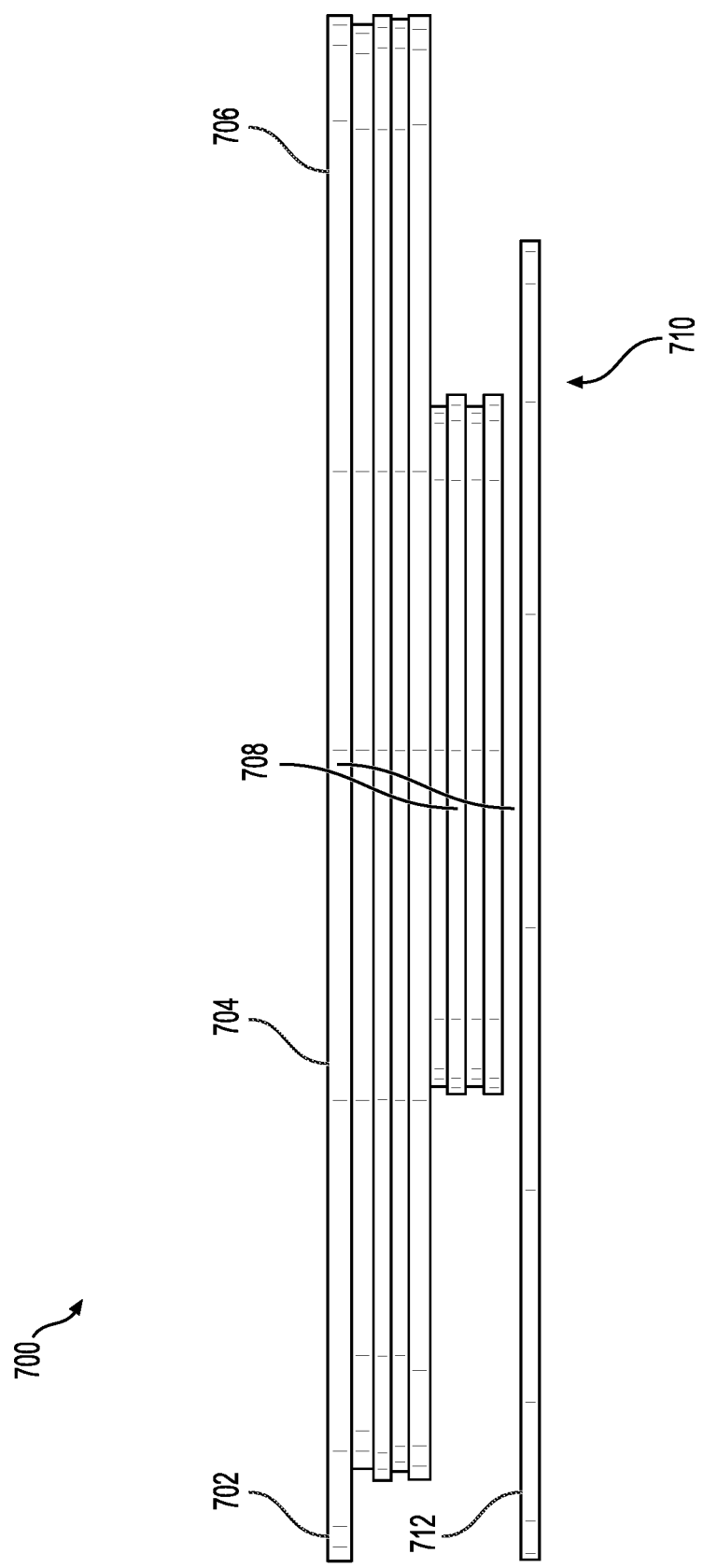
FIG. 7 shows a side view of the metal layers of the MEMS device of FIG. 2.

FIG. 7 shows a side view 700 of the metal layers M1-M6 and via layers V2-V5 (because V1 is empty) of the MEMS device of FIG. 2 including connection 702 to the ASIC (upper electrode and proof mass), top metal plane 704, outer ring 706, proof mass 708, bottom metal plane 710, and lower electrode connection 712 to the ASIC.

Figure 8:
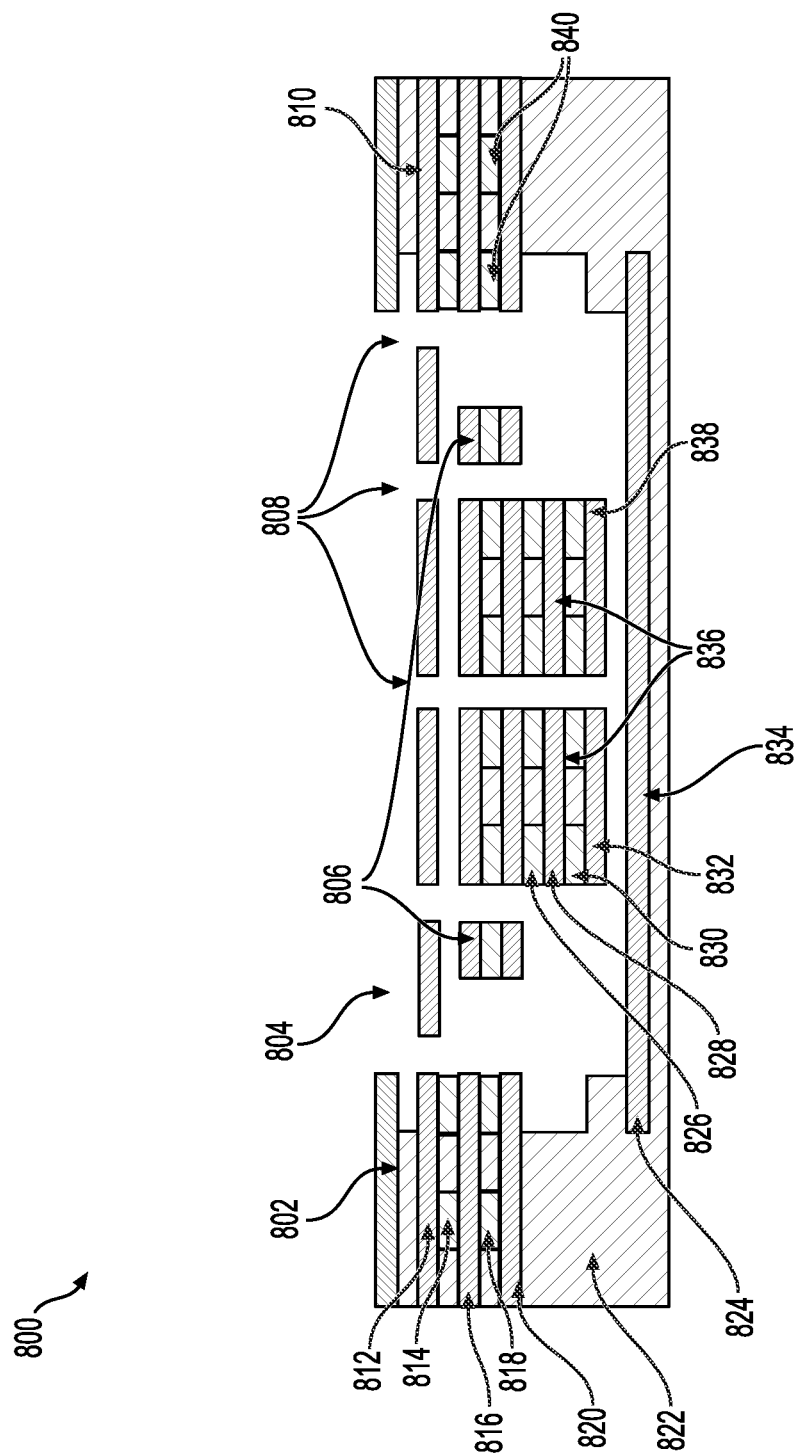
FIG. 8 is cross-sectional schematic diagram of the MEMS device of FIGS. 2, 6 and 7.

FIG. 8 is cross-sectional schematic diagram 800 of the MEMS device of FIGS. 2, 6, and 7. Diagram 800 shows passivation layer 802, passivation opening 804, springs 806, etching hole array 808, outer metal ring 810, M6 layer 812, V5 layer 814, M5 layer 816, V4 layer 818, M4 layer 820, SiO2 deposits 822, M1 layer 824, V3 layer 826, M3 layer 828, V2 layer 830, M2 layer 832, bottom metal plane 834, proof mass 836, array 838 of concentric via rings inside proof mass 836, and array 840 of concentric via rings along the outer metal ring 810.

MEMS devices are designed to operate in the linear region. This is because they have large dimensions, with large springs to make them soft enough despite their thickness, and the maximum displacement they can have, covering all the gap they have above, below, in front of or on a side, is very small. This way the MEMS spring obeys the Hook law, having a constant stiffness, that is generating a mechanical restoring force that is proportional with the displacement.

In certain instances, given that the displacement is large compared to the spring length, the mechanical restoring force starts being proportional to the displacement, but after a given initial displacement it is no longer linear and it increases faster. This way, although the springs are soft for small displacements around the equilibrium point, which is where the sensor will operate thus having very good sensitivity, in case that the proof mass experiences a larger displacement, for instance if submitted to a shock or strong vibration, touching the surrounding walls, roof or floor, the mechanical restoring force would be much larger at that point. This way the MEMS devices go back to the equilibrium position and detach from the stiction forces thanks to this increased mechanical restoring force at the point of contact.

In a more detailed view of this phenomenon, all springs are non-linear. However while other MEMS devices experience only small displacements, the devices described herein may experience larger displacements so that they enter into the non-linear region of the mechanical restoring force versus displacement before touching the surrounding walls, roof or floor.

We can count the length of the spring in two ways. One is the straight distance from one end to the other. The second measure is the whole distance along all of the length of the spring, following its meanders and curves. We will consider the longest of these measurements to be the "length" of the spring. In the implementations described herein, the shortest ratio between the minimal displacement that can lead to the spring touching a surrounding wall, roof or floor, and the length of any spring, is at least 1%, while in some designs it may be 5% or even 10%. This principle can also work for lower ratios, but then the robustness may not be sufficient. However, 0.5% or even 0.1% may provide sufficient results depending on the particular process and overall implementation. Such a short ratio is a factor to the MEMS devices described herein, not found in other MEMS designs, which allows for implementations of soft springs and short gaps to realize high performance devices able to be packaged with all packaging technologies, including WLCSP, while at the same time having high yield and reliability.

Another inventive concept includes the design of the vertical walls, or more precisely, the definition of the MEMS area, or the limit of the lateral etching of the silicon oxide, and the mechanical anchors or supports of the MEMS. As explained before, other designs use vertical metal walls or anchors.

On the first case, using vertical metallic walls, we cannot use a top metal layer and/or a bottom metal layer to seal the device from the top and/or bottom. This means that we will need a special CMOS process without doped silicon below the lowest metal layer of the BEOL, and/or a special, more expensive packaging technique like a laminate substrate to properly protect the MEMS cavity from the top, and usually also a more expensive post processing etching sequence. This may be avoided totally or partially if the MEMS device is allowed to have the top and bottom metal planes electrically shorted with the surrounding walls, which usually would not be possible.

The second option, using anchors, although it disconnects electrically the top and bottom metal layers, it creates a large parasitic electrical capacitance between them, that degrades the device performance. Furthermore, any attempt to improve the performance reducing this parasitic capacitance, by means of reducing the anchor structure or increasing the vHF etching time, reduces the yield and reliability of the device.

The present inventive devices have neither the vertical metal walls connecting the top and bottom metal planes, nor the capacitive anchors. Instead there are two different solutions that these devices use. One solution is to extend the parts of the MEMS device located in between the top and bottom metal planes or electrodes, such as the springs, but it can also be other electrodes, so that they end up buried into the silicon oxide, sufficiently spaced away in the horizontal direction that the vHF does not reach there. In practice, we have seen that there is no need for a long distance. For a 180 nm CMOS node, it is enough to have 20 µm of metal around the MEMS device. Hence, there is metal placed around the MEMS device that is released, which holds it because the outer edge of it has silicon oxide around and/or adjacent to it that it is not etched way. Preferably this surrounding metal has a circular shape on its outer edge, but other shapes would be implemented.

In the previous solution, we had at least three electrical disconnected parts, where the top metal plane, the bottom metal plane and the part of the MEMS device in between them, are electrically disconnected, and more parts could be made electrically disconnected. An alternative implementation may be applied where, instead of having three or more electrically disconnected parts, there are only two. In this instance, part of the MEMS device may be attached in between the top and bottom metal planes to one of them by means of a vertical metal wall, but not to the other. In some implementations, the MEMS device is connected to the top one. This is because the top metal layer is usually less flat and more curved than the bottom metal layer. This is because the bottom metal layer is not detached from the underlying silicon oxide. In order to increase the mechanical consistency of these external rings, we can use an array of vias to join them. To make them even more robust, we can use instead of a regular square via array, an array of concentric via rings, like those used inside the proof mass. However in this case there will be no holes going through the external rings as it happens with the proof mass, and hence the rings will not have to be disrupted and they can be continuous.

Another implementation aspect that may be applied for these last two options, is that, since we do not use neither vertical metal walls shorting the top and bottom metal planes, nor we join them with capacitive anchors, we can then reduce the size of the bottom metal plane, compared to the size of the top metal plane that will be larger. The reason for this is that the lateral over-etching will be larger for the top metal than for the bottom metal layer, because in order to etch the bottom metal layer, vHF needs to etch down first to get there first. The lateral over-etching is the distance that goes from the outermost edge of the passivation opening window above the MEMS device that we need to release, until the outermost location where there is silicon oxide etched after the vHF post processing step. That is, since we do not use metal vertical walls shorting from top to bottom nor use capacitive anchors, but instead we surround the MEMS device by metal area that extends into the silicon oxide around, part of this metal area will have its surrounding silicon oxide etched away during the vHF step while beyond some point it will no longer be etched.

With this approach, we reduce the parasitic capacitance between the top and bottom metal planes, which is also the parasitic capacitance between the top or bottom metal planes and the moveable part of the MEMS device, in case of using the second approach disclosed above, that is when we shorten the part between the top and bottom metal planes with one of these vertical planes or connections. This reduction of the parasitic capacitance results in improved device sensitivity or performance.

The size for a reduction of the width of the external ring at the lower metal plate compared to the top one will depend on the CMOS process and overall design. But, in some implementations, it will be between 10% and 50%, with a preferred value of 30%. In some implementations, a width for the outer ring at the top metal plate is 20 µm, which means that the external ring width at the bottom metal plate may have a preferred size of 6 µm. If the central disc (proof mass plus springs) has a diameter of 50 µm, then the total size of the top plate may have a diameter of 90 µm, and the diameter for the whole bottom plate may have a diameter of 62 µm.

If we anchor the part in between the top and bottom metal planes with metal areas extending around this part that end up buried into the unetched silicon oxide, then we can also make them with a size that is smaller than the top metal plane but larger than the bottom metal plane. Because in this case their over-etching, it will be somewhat in between the top and bottom metal planes. In some implementations, the external ring width for this middle plate or plates it will be between 30% and 70% the width of the ring for the top metal plane. In one implementation, the value would be 50%. However it will ultimately depend on the specific CMOS process and the overall design. If the top metal plane has a circular shape, it may include an internal disc adjacent to an external ring surrounding it. The internal disc may have an array of holes in it to allow the vHF to go inside the MEMS cavity, while the external ring is solid (with the possible exception explained below for building a trench to isolate most of this external ring electrically).

The extension of the internal disc is in principle the extension of the MEMS that we want to release with the vHF. However another inventive concept is to reduce the extension of the inner disc, thus not placing release holes around the outer part of the MEMS that needs to be released. Since vHF can travel a relatively long distance, all the MEMS will be released and we will minimize the over-etching on the external ring in all the metal layers, thus being able to reduce the sizes of these external rings. This will reduce the parasitic capacitance between the top and bottom metal plates, thus improving the performance of the MEMS. In case of using this reduced extension for the release holes, the passivation opening can be reduced also, since we only need to open it above the area having the array of holes.

The reduction of the internal disc that we can be implemented will depend on the CMOS process, but in certain implementations it will be between 2 µm and 20 µm on each side, with a preferred value of 6 µm. That is the disc diameter will be reduced between 4 µm and 40 µm, with a preferred diameter reduction of 12 µm. Implementing this reduction of the internal disc can reduce the external ring to the same value at all the metal layers that have such external ring. For clarification, although the internal disc and external ring is discussed, in practice the layout of the top metal layer will be a single disc. Then the etching holes array will be located in the center, covering an area that is defined by the size of the internal disc. Hence, the surrounding solid area without etching holes may be referred to as the external ring. Also for clarification, when we say that we reduce the internal disc, this does not affect the size for the proof mass, springs or other parts of the MEMS device that need to be released. The internal disc here it defines only the area above the MEMS device or parts that need to be released, that have an array of etching holes.

The above descriptions are valid also in the case of having several electrically disconnected parts in between the top and bottom metal layers. In such instances, each one will have its own metal extensions buried into the silicon oxide, and they will all be electrically disconnected between them, although there will always be some electrical parasitic capacitances.

Although the preferred approach is to have this exterior metal area to support the MEMS parts in between the top and bottom metal planes, surrounding all the released MEMS inside, to provide better mechanical consistency, it is not strictly necessary. This can be useful especially in the case disclosed above where there are two or more electrically disconnected MEMS parts in between the top and bottom metal layers. One example of this is for an in-plane inertial sensor, where there are several lateral electrodes positioned to sense acceleration in different directions.

Another variant that reduces the parasitic electrical capacitance between the top metal plane (and also the middle part of the MEMS device if electrically shorted to it by means of for example a vertical metal connection to it) and the bottom metal plane, is to add a very short trench around all of the top metal plane at a certain distance from the MEMS that needs to be released. In some implementations, this trench is located at half of the over-etching distance. In one configuration, this is at about 10 µm, as the overall length of this metal area around the MEMS is of about 20 µm. But the distance can be made shorter, down to 5 µm or even less, than to zero. Preferably it will be located at a distance between 5 µm and 15 µm. And the extension of the top metal plate may be a distance of about 20 µm. But, it could be between 5 µm and 30 µm, depending on the specific CMOS process properties, and the overall MEMS design and the required vHF properties and recipe.

The width of the trench should be minimal, as allowed by the process. This width may be 0.8 µm but, in some implementations, will fall between 0.5 µm and 2 µm, depending on the process and especially the thickness of the top metal layer. A metal ring may be implemented beyond this trench to sustain the passivation. With this trench, the outer ring is divided into two parts, one inside the other, that will be electrically disconnected, and mechanically disconnected as well. Although there will be some parasitic electrical capacitance between them and also they will ultimately be connected to the silicon oxide and hence they will not move relative one to the other.

Hence, it could be questioned why we need to keep the outside part of this divided outer ring. The reason is that there will be over-etching during the vHF post processing step, so that the silicon oxide located between the passivation and this top metal layer will be etched away, leaving the passivation very fragile. For this reason, it is better to keep the outer most metal ring, in case the passivation breaks so that it can be supported. However, depending on the process properties and overall design, it might be possible just to remove this external part of the outer ring, and instead of building a trench for the outer ring, just reduce its diameter. This would reduce the parasitic capacitances even more.

A preferred implementation will have a short vertical metal wall surrounding the MEMS device and connected to the top metal plane. This vertical metal wall may or may not be connected to a moving part of the MEMS located in between the top and the bottom metal planes, such as the spring anchors. The purpose of this short (i.e. not going down to the bottom metal plane) wall is to block the vHF from etching horizontally under the top metal plane towards the outer edges of it, forcing the vHF to go down the vertical wall first and then back upwards to be able to etch under the top metal plane towards the outer edges. Depending on the implementation, this short vertical metal wall can also provide mechanical consistency and/or an electrical connection to other parts of the MEMS device, such as for instance the anchors of the springs.

Another implementation to achieve a mechanical connection without electrically shorting two parts of the MEMS without using the capacitive anchors, is to use a MIM layer in the MEMS process. This layer is usually not etched away with vHF, or at least etched slowly, although it depends on the specific CMOS process. This provides a more compact solution than the capacitive anchors. However the electrical capacitance tends to be larger, and the mechanical robustness may not be adequate. However it might still be useful in some implementations, depending on the MEMS device, process and overall design. For some implementations, it may also be useful to use horizontal capacitive anchors instead of vertical capacitive anchors. In some configurations, a mixed design may be implemented, while implementing feedthroughs to pass connections across MEMS metal walls or planes using the same design principle like capacitive anchors of any type or a combination of types.

The array of holes at the top metal plane 222 will be as small as possible. They may be smaller than what is allowed by the DRC of the process, but big enough to make sure that they are open through all the top metal thickness. This minimum size will depend on the specific CMOS process and especially on the top metal thickness. In some implementations, the size is 0.8 µm in width. Below this it is usually difficult that they open completely, which would lead to a low yield in production. Larger values may not be properly filled when we apply the sealing layer as explained later. So there is a trade-off and we cannot have neither too small holes that would not open when patterning the top metal layer during the CMOS process, nor too big that would not be properly sealed later during the packaging. Hence, in some implementations, the hole size will be between 0.5 µm and 1.5 µm, with a preferred value of 0.8 µm. However depending on the CMOS process, the top metal thickness, and the sealing material, thickness and process being used, the etching hole size may vary. Given that the holes are so small in some implementations, they will be drawn as square holes, because in reality any other shape would not make any difference, as we will be forcing the resolution of the process, and they will be partially rounded anyway during the manufacturing of the device.

The separation between the holes on the top metal plane, e.g., top plate 222, may be similar to the vertical length of the vertical distance from the top to the bottom metal layers M1 to M6. In some configurations, the etching holes are spaced horizontally on the top metal layer 222 up to a distance of at least twice this vertical distance between M1 and M6. In some implementations, the distance may be greater, given that vHF etches slowly in the vertical direction compared to the horizontal direction, due to the multiple oxide sublayers with different densities and etching speeds. Because the goal is to make sure that we etch properly all the volume inside the MEMS cavity, the holes may be placed close enough, but at the same time as much as possible to prevent formation of a weak top metal plane with so many holes and little metal remaining, which may not be able to withstand the sealing on top of it when the device is packaged, as explained later herein.

We have found experimentally that a sufficient value is to have the etching holes spaced a distance between 50% and 200% of the height of the metal stack. This height is counted from the lowest point of the bottom metal layer M1 up to the highest point of the top metal layer, e.g., M6. A preferred value is to separate the holes a distance equal to this height (e.g., 100%). The hole distance is measured from the center of one hole to the center of another hole in both the horizontal (X) and vertical (Y) directions.

In order to allow the vHF to go down to the lowest level of silicon oxide so that all the silicon oxide that needs to be removed is properly etched in all the cavity, the same array of holes is implemented that goes through all the MEMS device inside the cavity. This might be shifted laterally with respect to the holes on the top metal plane, although the preferred implementation will be just to place them at the same locations. If these holes go through structures that do have silicon oxide trapped inside, such as the proof mass, these holes may be surrounded with via walls, to avoid the vHF going inside through these holes and etching away the silicon oxide that we want to keep unetched. Given the small size of these holes, which may be made preferably with square shapes, these via barriers may be implemented as square rings.

A fourth inventive concept is the usage of the sealing layer existing in the WLCSP process, also referred to as repassivation, which is typically made with Polyimide (PI), but it could also be Benzocyclobuten (BCB) or others, to seal the MEMS cavity. This avoids the need for a specific aluminum sputtering and patterning process, reducing the complexity and cost of the post-processing, which is further reduced only to the vHF etching and post backing. In addition to this, using PI or BCB has been seen to offer a better seal, covering better the array of holes on the top metal layer. In contrast aluminum sputtering requires a very thick deposition, and even then, due to the conformality of the deposition, some holes may not be properly sealed. This does not happen with PI, which seals all the holes very well. In instances involving another type of package not being WLCSP, a process could still apply a PI or BCB or other coating and patterning (even aluminum sputtering, although it would not be ideal, but it could be done with enough thickness and the proper set of parameters), and then proceed with whatever packaging process.

Another key inventive concept includes not using metal filling structures within the MEMS cavity. In order to compensate for the metal residual stress, CMOS designs need to have a constant metal density across all the area of the ASIC. In order to achieve this, once the ASIC design is finalized, an automatic process called "metal filling" is performed, which fills all the empty areas with random small metal shapes, in order to achieve the required target metal density. This metal filing must not be performed within the MEMS cavity. Otherwise after applying the vHF all these tiny metal filing structures would be released and they would attach by stiction to the MEMS devices, preventing it from working properly, or not letting it to work at all.

All the explanations given in this application can be applied to different CMOS nodes, to different metal stacks and even different solid state semiconductor processes. Also when we describe the top metal layer and the bottom metal layer, these are usually the top most and the bottom most metal layers in the process layer stack. However, it may be applicable to other metal layers. In the case of building an inertial sensor in a 6 metal layer process, we will usually need all the metal layers available in order to maximize the thickness and hence the mass of the sensor proof mass. However if the process has more metal layers available, or if we build another type of MEMS device, or even for a inertial sensor if we can manage to get the required specifications, we may not need to use all the metal layers available in the metal stack. In this case, we will preferably use those located on the top, thus leaving the metal layers located at the bottom to be used for the ASIC to make electrical connections into the ASIC. In this case, there would not be any dedicated area to implement the MEMS, but instead the MEMS would be implemented above the ASIC.

In all cases, the active area (FEOL) below the MEMS may be used to implement the ASIC. However if there are no metal layers available to be used for the connections, because they are all used to implement the MEMS, then it will be difficult to implement a useful part of the ASIC below the MEMS. But, depending on the process and the specific ASIC design, it may be useful to implement large transistors or other circuitry requiring little wiring, and/or polysilicon lines if available may be used for this wiring. When not all the metal layers of the process stack are used to implement the MEMS, then all the explanations of this application should be understood in the following way. The "top" and the "bottom" metal layers are not then the top most and bottom most of the metal stack, but they are then the top most and the bottom most of the metal layers used to implement the MEMS device. Although the preferred embodiment includes using circular and round shapes, the disclosed inventions can be applied to other types of shapes.

Yet another key inventive concept includes the sensing electronics to interface the MEMS, when they are capacitive MEMS sensors such as, without limitation, accelerometers, bone conduction sensors, motion detectors, ultra-sound sensors or any other capacitive sensor. In certain implementations, the MEMS capacitive sensors herein include a uniquely small capacitance. This is because of the small size unique feature, and also the minimal parasitic capacitance, resulting from the several concepts explained previously. Also, because of the proximity of the ASIC, attached to the MEMS edge, and without needing to wire the MEMS to another die where the ASIC would be located, and not even having to be connected to the top of the wafer where the ASIC would be placed in a wafer bonding scheme, or in the case of building the MEMS above the ASIC CMOS wafer.

In some implementations, the capacitance of the present MEMS sensors is in the order of 10 fF to 100 fF, or about 50 fF. This is about 100 times smaller than commercial MEMS devices for consumer electronics. This allows for implementation of a completely different sensing scheme that would not be feasible with other MEMS devices because it would imply too much power consumption.

In some configurations, the sensing of the MEMS capacitance is done by means of building a ring oscillator, where at least one of the capacitances of the loop is a MEMS device as described herein. This ring oscillator will feed a counter that will be read and reset every sample period. The output of the counter will already be digital and it will output the value of the capacitance. This approach has many technical advantages. First, it simplifies the analog design, being all digital, with the only exception of the ring oscillator. This means that there are many analog blocks that we would otherwise be needed, that is avoided here, such as a transconductance amplifier, programmable gain amplifier, ND converter, analog filters, chopper and capacitance mismatch compensation, among others. This simplification has many technical advantages: smaller ASIC area, so lower cost in production, reduced design time so faster time to market and lower development cost, easy porting to other CMOS nodes and processes, and lower power consumption.

The lower power consumption results from avoiding so many analog blocks that would be power hungry. In exchange for these blocks, however, the process will include charging and discharging continuously the MEMS sensor capacitance at a very high frequency, which may be between 10 MHz to 100 MHz, but depend on the MEMS design, CMOS process, and target specs for the sensor. This would consume too much power for the usual capacitances in the order of several pF. But for the present MEMS sensors having capacitances in the order of ×100 times or more lower, this will not imply more but actually less power consumption, making the inventive sensors very power efficient, in addition to the other advantages mentioned above for this sensing schema.

The ring oscillator may vary its frequency depending on many factors like supply voltage and its noise, temperature, and also process variations. To compensate for this, a second ring oscillator may be implemented that uses another MEMS device built very close to the first one, so that it will see almost the same process, voltage and temperature variations. This second MEMS device (or devices if more than one MEMS is included into the ring oscillator loop), will be slightly different, with a stiffer spring. Preferably, this will be made using a wider and/or thicker (i.e., using more metal stack-up) spring. This way the capacitance reading from the counter connected to this second sensor will move very little due to the magnitude that the sensor measures (e.g., acceleration in the case of an accelerometer), but it will change in the same way as the first one due to all the other factors, like supply voltage, process and temperature variations.

In one implementation, the two ring oscillators actuate a different counter each, until the second one reaches a predetermined value. In that case, we will read the first counter, which will give us the value of the magnitude being sensed, and then we will reset the two counters and start counting again. This predetermined value may be programmable, so that we can define different sampling frequencies. When the sampling frequency is low, the ring oscillators and/or the counters will be disabled between samples, thus minimizing power consumption. In some implementations, a third digital counter is included, with a very slow digital clock, to activate the device every time that a new sample needs to be acquired.

In some implementations, to increase the proof mass without increasing its size, metal walls are built and/or formed around all the perimeter of the MEMS device. In this way, silicon oxide is trapped inside the proof mass, and it is not etched away by the vHF. Furthermore, the proof mass with plenty of vias because these are made with tungsten, which has a higher density than silicon oxide and aluminum, which is the material of the metal layers. In order to further increase the effective density and the total mass of the proof mass, larger and closer via arrays may be implemented than what is allowed by the DRC of the process. In the case of a circular shaped proof mass, we can use also concentric via rings, spaced with the same distance than the thickness of the rings, preferably making this distance and rings width equal to the via size and via spacing defined by the CMOS process DRCs. It happens that although the vias of a CMOS process typically need to be squares of a fixed size, in practice we can extend these vias in one dimension, but at least we need to keep the specified via size in the other dimension. Otherwise the wafer would not be properly manufactured. Since we will need to make holes across the proof mass, these circular rings may have to be interrupted around the holes. Other shapes may be implemented for both the proof mass and the rings or via filing structures inside it.

Another key inventive concept includes modification of the pads. This is because there will be passivation openings not only above the MEMS devices, but also above each of the pads, i.e., vertically aligned with the pads. That is a reason why there is a passivation opening in the CMOS process. This means that when the vHF is applied post processing, the oxide under the passivation (i.e., between the passivation and the top metal layer) will be etched away. If the top metal layer at the pad is not large enough, the silicon etching will go beyond it and etch under the passivation without metal underneath. If this happens a lot of silicon oxide around the pad will be etched away, and the top passivation will end up having no oxide below. As a consequence the passivation can break and also a lot of silicon oxide can be etched away, ruining part of the ASIC electronic circuitry. An implementation to solve this technical problem is to extend at least the top metal layer (and if we extend more or all the other metal layers even better to provide better consistency) more than with a conventional pad design. This extension will depend on the details of the specific process and vHF etching that is applied. In some implementations, the metal will have a lateral extension of between 15 µm and 25 µm beyond the passivation opening in all directions. In one implementation, this extension will be 20 µm. There is no need to use rounded shapes, so, in various implementations, the pad will keep having a square design for the passivation opening, and so also the metals that define it. However other shapes would also be implemented.

Most of the inventive concepts disclosed herein can be applied to many different devices, including, but not limited to, inertial sensors, gyroscopes, pressure sensors, ultrasound sensors and transducers like CMUTs, loudspeakers, magnetometers and compasses, microphones, RF switches, tunable capacitors, RF inductors, temperature sensors, and many more. To avoid requiring a CMOS foundry to increase the silicon content of the passivation, we can use, for example, a special recipe and/or equipment developed by, for example, Memsstar (Scottland). After the vHF etching step we bake the wafer, in order to sublimate the fluorine residues.

Thanks to the smaller size and cost, and higher performance of the MEMS devices disclosed herein, plus their high volume production capability and short time to market, the present inventive concepts enable building of smaller and higher performance smartphones, wearables and earbuds, having more functionality and longer life and autonomy thanks to having more space for a larger battery. These sensors are also an enabler for many Internet of Things (IoT) applications, where there is a requirement for ultra low cost and small sensors, produced in very large volumes, while having very low power consumption (high performance). Another application example would be RFIDs with sensors embedded.

Figure 9:
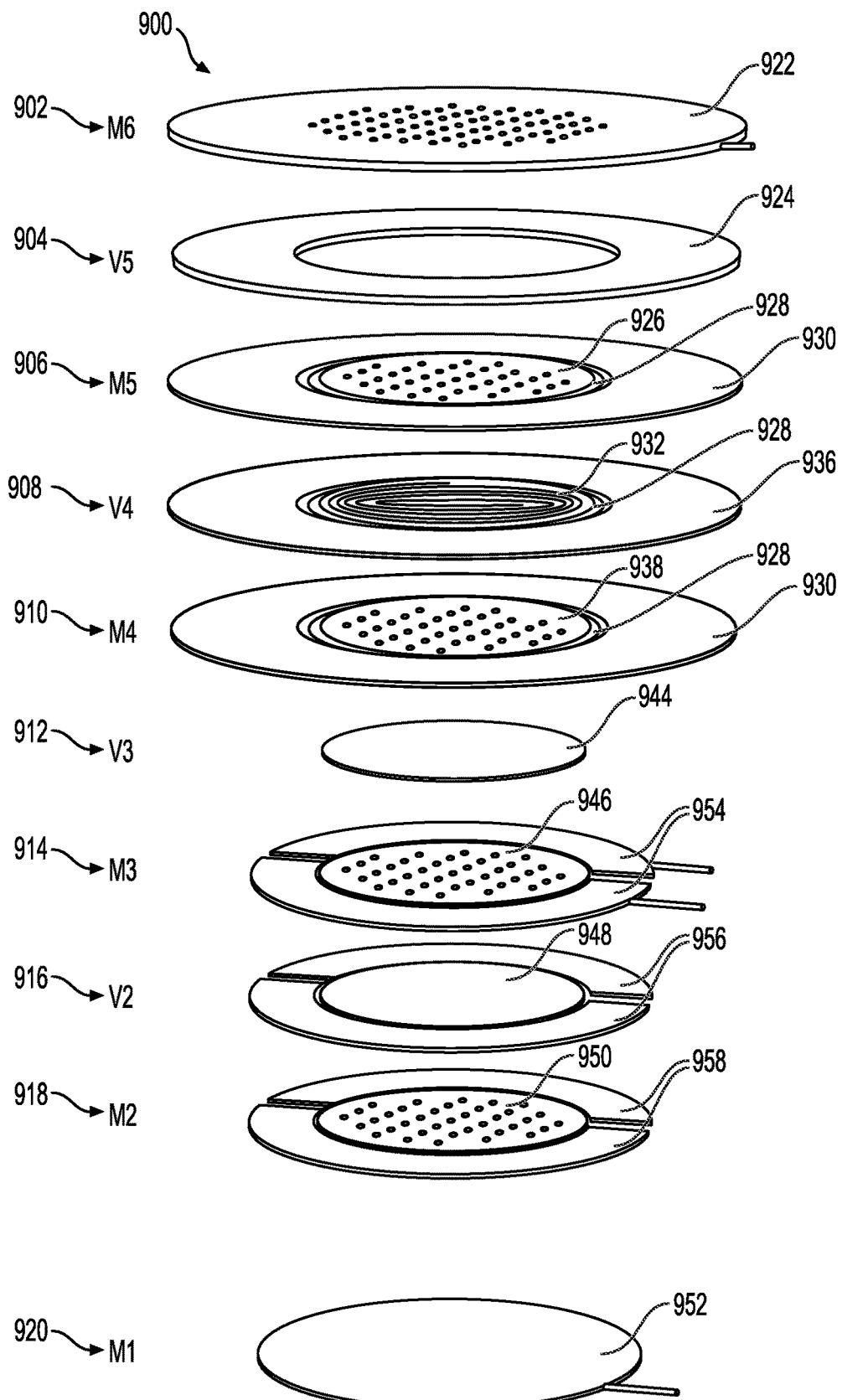
FIG. 9 is an exploded view of the metal and via layers of a MEMS device including lateral electrodes.

FIG. 9 is an exploded view of the metal and via layers of an MEMS device 900 including lateral electrodes. FIG. 9 shows a variant of the implementation of FIG. 2 to sense in plane acceleration including lateral electrodes around the bottom part of the proof mass where there are no springs. That is, the proof mass is made up with 4 metal layers, M2 to M5. The springs are made with metal layers M4 and M5, having outer metallic rings to support them. Therefore, the proof mass does not use the metals around it at layers M2 and M3. This way we can use layers M2 and M3 to build lateral electrodes for the proof mass. The shape of these lateral electrodes is essentially like the outer rings of the above metal layers (M4 and M5), but instead of a whole ring, there are two half rings. Each of these half rings is made with the two available metal layers (M2 and M3), stacked up together, which means that there is plenty of vias inside to join them. These vias are shaped as an array of concentric half rings.

The external diameter of these lateral electrodes is shorter than the outer ring of the upper metal layers. In this design it is made shorter also than the bottom metal plane, but an improvement would be to make the bottom metal plane diameter smaller than the outer diameter of these lateral electrodes.

Since we keep having the bottom metal plane, we can still sense out-of-plane acceleration as well. Therefore, the MEMS device has several electrodes, which allow for the sensing of 1, 2 or even the 3 axis altogether with the same device. This is enabled if instead of dividing these lateral electrodes in half rings, they are divided into quarter rings. Furthermore, for the X and Y axis (i.e., in-plane acceleration), differential capacitances may be implemented. While this design is for an inertial sensor, the same design principle (electrodes, springs supports, and so on) may be used to implement other types of capacitive sensors and actuators.

MEMS device 900 includes M6 layer 902, V5 layer 904, M5 layer 906, V4 layer 908, M4 layer 910, V3 layer 912, M3 layer 914, V2 layer 916, M2 layer 918, and M1 layer 920. M6 layer 902 includes a top plate 922 with etching holes arranged in an array and a connection to an ASIC. V5 layer 904 includes an array of concentric via rings 924 extending over the outer metal. M5 layer 906 includes a proof mass top lid 926 with array of etching holes. Layer 906 also includes a portion of spiral springs 928 and an outer metal ring 930. V4 layer 908 includes array 932 of concentric via rings extending over the outer metal, a portion of the spiral springs 928 that extends in the V4 layer 908, and an array of concentric via rings 936 extending over the proof mass stopping at the etching hole locations and surrounding them with square rings. M4 layer 910 includes a proof mass plane 938, a portion of spiral springs 928, and a portion of outer metal ring 930. V3 layer 912 includes an array of concentric via rings 944 extending over the proof mass and stopping at the etching hole locations while surrounding the hole locations with square rings. M3 layer 914 includes proof mass metal plane 946 with an etching hole array and lateral electrodes 954 with connections to the ASIC. V2 layer 916 includes an array 948 of concentric via rings extending over the proof mass, stopping at the etching hole locations and surrounding them with square rings. V2 layer 916 also includes array 956 of concentric via half rings extending over the lateral electrodes. M2 layer 918 includes proof mass metal bottom lid 950 having an etching hole array. M2 layer 918 also includes lateral electrodes 958. M1 layer 920 includes bottom metal plane 952 including a connection to an ASIC.

Elements or steps of different implementations described may be combined to form other implementations not specifically set forth previously. Elements or steps may be left out of the systems or processes described previously without adversely affecting their operation or the operation of the system in general. Furthermore, various separate elements or steps may be combined into one or more individual elements or steps to perform the functions described in this specification.

Other implementations not specifically described in this specification are also within the scope of the following claims.

What is claimed is:

1. A MEMS device formed using the materials of the BEOL of a solid state semiconductor process, wherein:
    a post-processing of vHF and post backing was applied to form the MEMS device,
    a total size of the MEMS device is between 10 um$^2$ and 22,500 um$^2$;
    three springs are distributed evenly around the MEMS device and rotated around a central axis of the MEMS device; and
    the MEMS device shape is round and the springs have a spiral shape.

2. The MEMS device of claim 1, wherein the total size of the MEMS device is between 10 um$^2$ and 10,000 um$^2$.

3. The MEMS device of claim 1, wherein the springs are made with one of a single metal layer and a stack-up of at least two metal layers.

4. The MEMS device of claim 3, wherein the MEMS device is an inertial sensor.

5. The MEMS device of claim 4 comprising a proof mass, wherein the proof mass is made with a stack-up of four metal layers and the springs, wherein the springs are one of: made and connected with a top metal layer of the proof mass forming the stack-up and connected with two top metal layers of the stack-up.

6. The MEMS device of claim 4, wherein the springs are connected to an external ring such that a portion thereof remains buried into a silicon oxide on its outer edge after the vHF etching.

7. The MEMS device of claim 1, wherein the MEMS device has a top metal plane and a bottom metal plane that is smaller than the top one.

8. The MEMS device of claim 7, wherein an outer ring width of the bottom metal plane is less than or equal to 10% to 50% the width of an outer ring of the top metal plane.

* * * * *